United States Patent
Kim

(10) Patent No.: US 12,089,448 B2
(45) Date of Patent: Sep. 10, 2024

(54) DISPLAY DEVICE

(71) Applicant: Samsung Display Co., Ltd., Yongin-si (KR)

(72) Inventor: Hwi Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/298,534

(22) Filed: Apr. 11, 2023

(65) Prior Publication Data

US 2023/0263009 A1    Aug. 17, 2023

Related U.S. Application Data

(63) Continuation of application No. 17/036,680, filed on Sep. 29, 2020, now Pat. No. 11,637,161.

(30) Foreign Application Priority Data

Oct. 29, 2019   (KR) .......................... 10-2019-0135587

(51) Int. Cl.
*H01L 27/14*    (2006.01)
*H10K 59/121*   (2023.01)
(Continued)

(52) U.S. Cl.
CPC ..... *H10K 59/1213* (2023.02); *H10K 59/1216* (2023.02); *H10K 59/131* (2023.02);
(Continued)

(58) Field of Classification Search
CPC .......... H10K 59/1213; H10K 59/1216; H10K 59/131; H10K 59/1201; H10K 59/121;
(Continued)

(56) References Cited

U.S. PATENT DOCUMENTS 7,599,014 B2    10/2009  Shih
8,018,538 B2     9/2011  Mori et al.
(Continued)

FOREIGN PATENT DOCUMENTS

CN        101285976        10/2008
CN        108254954         7/2018
(Continued)

*Primary Examiner* — Tan N Tran
(74) *Attorney, Agent, or Firm* — KILE PARK REED & HOUTTEMAN PLLC

(57) ABSTRACT

A display device includes a substrate including a pixel area and a transmission area, and a pixel circuit disposed in the pixel area. The pixel circuit includes a first thin-film transistor included in a first multi-layer film, and a second thin-film transistor included in a second multi-layer film on the first multi-layer film. The first thin-film transistor and the second thin-film transistor are electrically connected to each other. The display device also includes a display element disposed on the second multi-layer film and including a pixel electrode electrically connected to the second thin-film transistor via a contact hole defined in the second multi-layer film, an opposite electrode facing the pixel electrode, and an intermediate layer between the pixel electrode and the opposite electrode.

19 Claims, 21 Drawing Sheets

(51) Int. Cl.
*H10K 59/131* (2023.01)
*G09G 3/3258* (2016.01)
*G09G 3/3266* (2016.01)
*H01L 27/12* (2006.01)
*H01L 29/786* (2006.01)

(52) U.S. Cl.
CPC ......... *G09G 3/3258* (2013.01); *G09G 3/3266* (2013.01); *G09G 2320/02* (2013.01); *G09G 2330/00* (2013.01); *H01L 27/1225* (2013.01); *H01L 27/124* (2013.01); *H01L 27/1251* (2013.01); *H01L 27/1255* (2013.01); *H01L 29/78675* (2013.01); *H01L 29/7869* (2013.01)

(58) Field of Classification Search
CPC ............... H10K 59/122; H10K 59/123; H10K 59/1315; H10K 50/80; G09G 3/3258; G09G 3/3266; G09G 2320/02; G09G 2330/00; G09G 2300/0426; G09G 3/3233; H01L 27/1225; H01L 27/124; H01L 27/1251; H01L 27/1255; H01L 29/78675; H01L 29/7869; H01L 27/1214
USPC ....................................................... 257/59, 72
See application file for complete search history.

(56) References Cited

U.S. PATENT DOCUMENTS

| | | | |
|---|---|---|---|
| 8,357,938 | B2 | 1/2013 | Yoon et al. |
| 9,040,981 | B2 | 5/2015 | Yamazaki |
| 9,093,042 | B2 | 7/2015 | Park et al. |
| 9,577,013 | B2 | 2/2017 | Park |
| 9,842,887 | B2 | 12/2017 | Sato |
| 10,050,099 | B2 | 8/2018 | Kim et al. |
| 10,510,813 | B2 | 12/2019 | Son et al. |
| 11,637,161 | B2 * | 4/2023 | Kim ................... H10K 59/1216 257/40 |
| 2006/0274239 | A1 | 12/2006 | Yang et al. |
| 2009/0224330 | A1 | 9/2009 | Hong et al. |
| 2019/0115407 | A1 | 4/2019 | Cho et al. |
| 2019/0229131 | A1 | 7/2019 | Chung et al. |

FOREIGN PATENT DOCUMENTS

| | | |
|---|---|---|
| KR | 10-2010-0003629 | 1/2010 |
| KR | 10-2012-0019026 | 3/2012 |
| KR | 10-2013-0086163 | 7/2013 |
| KR | 10-2017-0031849 | 3/2017 |
| KR | 10-1764543 | 8/2017 |
| KR | 10-1894720 | 10/2018 |

* cited by examiner

DISPLAY DEVICE

CROSS-REFERENCE TO RELATED APPLICATION(S)

This is a continuation application of U.S. patent application Ser. No. 17/036,680, filed Sep. 29, 2020, now U.S. Pat. No. 11,637,161, the entire contents of which are incorporated herein by reference. U.S. patent application Ser. No. 17/036,680 claims priority to and benefits of Korean Patent Application No. 10-2019-0135587 under 35 U.S.C. § 119, filed in the Korean Intellectual Property Office on Oct. 29, 2019, the entire contents of which are incorporated herein by reference for all purposes.

BACKGROUND

1. Technical Field

One or more embodiments relate to a transparent display device, the device performance of which may be maintained and simultaneously high transmittance of which may be achieved.

2. Description of the Related Art

The use of display devices has become diverse in a variety of fields. Since the thicknesses and weights of the display devices have decreased, the range of the usage thereof has widened.

For example, these display devices may be used in various ways, such as a display of a small product such as a mobile phone, a display of a large product such as a television (TV), a head up display (HUD) of a vehicle, or an electronic device for artificial intelligence (AI). Transparent display devices having a light-transmitting property may be desirable according to the application.

However, in conventional display devices, there have been hurdles in their development such that it is difficult to increase transmittance of a display device since an area needs be secured for a light-emitting device, and that in order to increase the transmittance, the performance of the light-emitting device may be degraded.

Therefore, it is desired that the performance of a display device may be maintained while transmittance of the display device increases.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

According to embodiments, a display device may include a substrate including a pixel area and a transmission area, and a pixel circuit disposed in the pixel area and including a first thin-film transistor included in a first multi-layer film, and a second thin-film transistor included in a second multi-layer film on the first multi-layer film. The first thin-film transistor and the second thin-film transistor may be electrically connected to each other. The display device may include a display element disposed on the second multi-layer film and including a pixel electrode electrically connected to the second thin-film transistor via a contact hole defined in the second multi-layer film, an opposite electrode facing the pixel electrode, and an intermediate layer between the pixel electrode and the opposite electrode.

The first multi-layer film and the second multi-layer film may extend into the transmission area, the first multi-layer film may include a first transmission opening in the transmission area, and the second multi-layer film may include a second transmission opening in the transmission area.

The display device may further include a light-transmitting filling layer disposed in the first transmission opening and the second transmission opening.

The first thin-film transistor may include a first semiconductor layer, a first gate electrode that overlaps the first semiconductor layer, and a first conductive layer electrically connected to the first semiconductor layer. The first multi-layer film may further include an insulating layer disposed on the first conductive layer to cover the first conductive layer.

The first thin-film transistor and the second thin-film transistor may be electrically connected to each other via a contact hole defined in the insulating layer.

The pixel circuit may further include a storage capacitor including an upper electrode and a lower electrode that overlap each other, and the lower electrode and the first gate electrode may include a same material.

The upper electrode may be between the first gate electrode and the first conductive layer.

The lower electrode may overlap the first semiconductor layer.

The second thin-film transistor may include a second semiconductor layer disposed on the first conductive layer, a second gate electrode that overlaps the second semiconductor layer, and a second conductive layer electrically connected to the second semiconductor layer.

The first semiconductor layer may include polycrystalline silicon, and the second semiconductor layer may include an oxide semiconductor material.

The first gate electrode and the second gate electrode may include a same material.

At least part of the first conductive layer and at least part of the second conductive layer may overlap each other.

The first conductive layer and the second conductive layer may include the same material.

The pixel circuit may further include a scan line that extends in a first direction, and the scan line and the first gate electrode may include a same material.

The pixel circuit may further include a data line that extends in a second direction crossing the first direction, and the data line and the first conductive layer may include a same material.

The first thin-film transistor may include a driving thin-film transistor.

The second thin-film transistor may include an emission control thin-film transistor.

The first multi-layer film may further include a third thin-film transistor, and the third thin-film transistor may include at least one of a switching thin-film transistor, a compensation thin-film transistor, and an operation control thin-film transistor.

The second multi-layer film may further include a fourth thin-film transistor, and the fourth thin-film transistor may include an initialization thin-film transistor.

The first multi-layer film may include a scan line and an emission control line that extend in the first direction, and the second multi-layer film may include a previous scan line and an initialization voltage line that extend in the first direction, and the scan line, the emission control line, and the previous line, and the initialization voltage line may bypass the transmission area.

According to other embodiments, a display device may include a substrate including a pixel area including a pixel circuit and a display element electrically connected to the pixel circuit, and a transmission area, a first active pattern disposed in the pixel area, a first gate pattern disposed on the first active pattern, a first conductive pattern disposed on the first gate pattern, a second active pattern disposed on the first conductive pattern, a second gate pattern disposed on the second active pattern, a second conductive pattern disposed on the second gate pattern, and a pixel electrode disposed on the second conductive pattern. The pixel circuit may include a first thin-film transistor including a first semiconductor layer and a second thin-film transistor including a second semiconductor layer, the first semiconductor layer may be a part of the first active pattern, and the second semiconductor layer may be a part of the second active pattern.

The first active pattern and the second active pattern may be electrically connected to each other via a bridge pattern between the first active pattern and the second active pattern.

The first active pattern and the second active pattern may be electrically connected to each other via a contact hole defined in an insulating layer between the first active pattern and the second active pattern.

The first active pattern may include polycrystalline silicon, and the second active pattern may include an oxide semiconductor material.

The pixel circuit may include a storage capacitor including a lower electrode and an upper electrode, the first gate pattern may be used as the lower electrode, and at least part of a third conductive pattern between the first gate pattern and the first conductive pattern may be used as the upper electrode.

The pixel circuit may further include a scan line and a first emission control line that are disposed on the same layer as the first gate pattern and extend in a first direction, and a previous scan line and a second emission control line that are disposed on the same layer as the second gate pattern and extend in the first direction.

The first gate pattern and the second gate pattern may include a same material.

The first conductive pattern and the second conductive pattern may include a same material.

Other aspects, features, and advantages of certain embodiments of the disclosure than the above-described aspects, features, and advantages will be apparent from a detailed description, the claims, and the drawings for implementing the following invention.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1A:
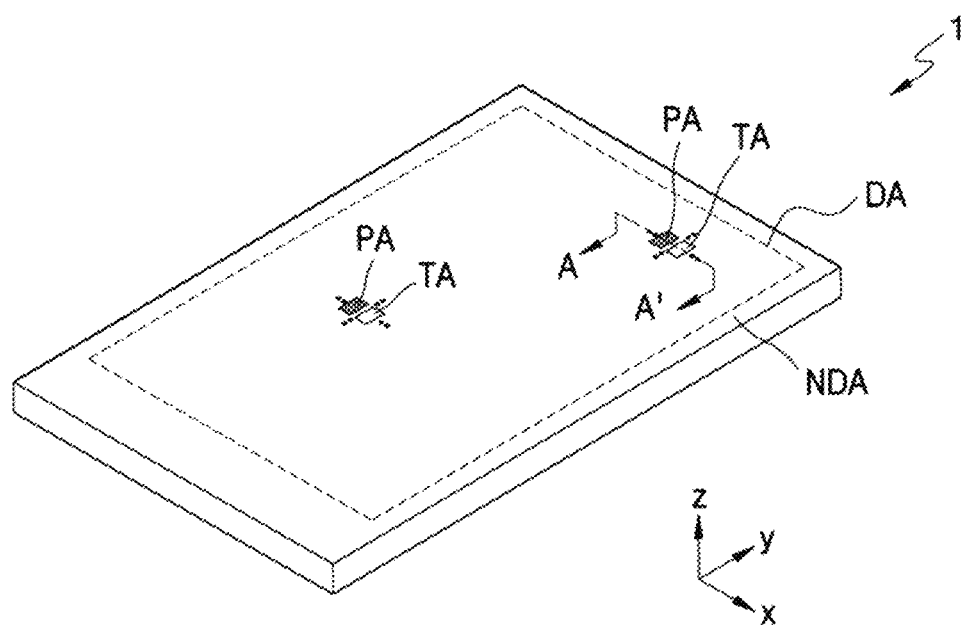
FIGS. 1A and 1B are perspective views schematically illustrating display devices according to embodiments.

Reference will now be made in detail to embodiments, examples of which are illustrated in the accompanying drawings. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. The terms "and" and "or" may be used in the conjunctive or disjunctive sense and may be understood to be equivalent to "and/or." Throughout the disclosure, the expression "at least one of a, b, and c" indicates only a, only b, only c, both a and b, both a and c, both b and c, all of a, b, and c, or variations thereof.

Hereinafter, embodiments of the disclosure will be described below in more detail with reference to the accompanying drawings. Those components that are the same or are in correspondence are rendered the same reference numeral regardless of the figure number, and a redundant description therewith may be omitted.

It will be understood that although the terms "first," "second," etc. may be used herein to describe various components, these components should not be limited by these terms. These terms are only used to distinguish one component from another.

As used herein, the singular forms "a," "an" and "the" are intended to include the plural forms as well, unless the context clearly indicates otherwise.

It will be further understood that terms such as "comprise", "comprising", "has", "have", "having", "include", and "including" as used herein specify the presence of stated features or components, but do not preclude the presence or addition of one or more other features or components.

It will be understood that when a layer, region, or component is referred to as being "formed on" or the like with respect to another layer, region, or component, it may be directly or indirectly formed on the other layer, region, or component. For example, intervening layers, regions, or components may be present.

Sizes of elements in the drawings may be exaggerated for convenience of explanation. In other words, since sizes and thicknesses of components in the drawings may be arbitrarily illustrated for convenience of explanation, embodiments are not limited thereto.

When a certain embodiment may be implemented differently, a specific process order may be performed differently from the described order. For example, two consecutively described processes may be performed substantially at the same time or performed in an order opposite to the described order.

"A and/or B" represents A, B, or A and B. "At least one of A and B" represents A, B, or A and B.

It will be understood that when a layer, region, or component is referred to as being "connected to" or the like with respect to another layer, region, or component, it may be directly or indirectly connected to the other layer, region, or component. For example, intervening layers, regions, or components may be present.

The x-axis, the y-axis and the z-axis may not be limited to three axes of the rectangular coordinate system, and may be interpreted in a broader sense. For example, the x-axis, the y-axis, and the z-axis may be perpendicular to one another, or may represent different directions that may not be perpendicular to one another.

The term "overlap" may include layer, stack, face or facing, extending over, covering or partly covering or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Hereinafter, an organic light-emitting display device will be described as an example of a display device 1 according to an embodiment. However, the display device according to the disclosure is not limited thereto. In another embodiment, the display device 1 according to the disclosure may be a display device, such as an inorganic light-emitting display device or an inorganic electroluminescence (EL) display device, or a quantum dot light-emitting display device. For example, an emission layer of a display element in the display device 1 may include an organic material, an inorganic material, quantum dots, an organic material and quantum dots, or an inorganic material and quantum dots.

Figure 1B:
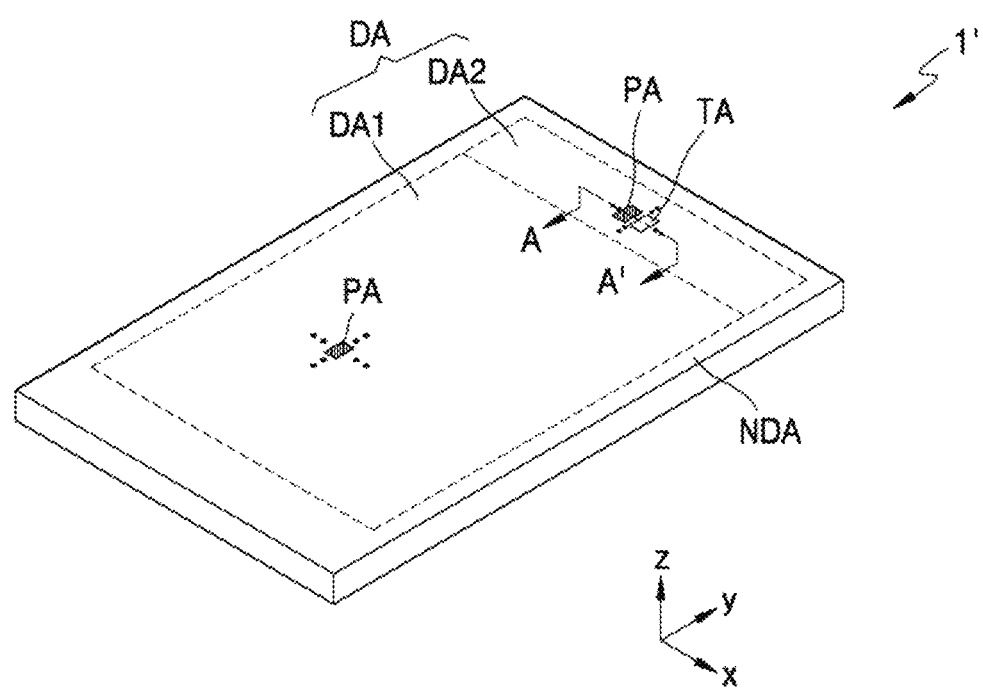

FIGS. 1A and 1B are perspective views schematically illustrating display devices 1 and 1' according to embodiments.

Referring to FIG. 1A, the display device 1 may include a display area DA, in which an image may be realized, and a non-display area NDA that may be a peripheral area in which no image may be realized. Pixels may be disposed in the display area DA and may provide an image to the outside due to light emitted from the pixels. The non-display area NDA may be outside the display area DA and may surround the display area DA.

The display area DA may include a pixel area PA and a transmission area TA. Pixel areas PAs and transmission areas TAs in combinations may be in the display area DA. The pixel area PA may be an area in which pixels may be disposed and may be an area in which emission may be substantially performed. Although not shown, the pixels in the pixel area PA may be of a variety of types, such as stripe types, pentile types, and mosaic types.

The transmission area TA may be an area in which no pixels may be disposed and may be an area through which light passing a substrate 100 may be transmitted. An organic layer and/or an inorganic layer may be located in the transmission area TA. In another embodiment, the substrate 100 may be located in the transmission area TA, and all layers on the substrate 100 may be removed. In another embodiment, the substrate 100 may be located in the transmission area TA, and only an inorganic layer, such as a buffer layer, may be located on the substrate 100.

In FIG. 1A, transmission areas TAs may be disposed throughout the entire display area DA. A transmission area TA may be an area through which light may be transmitted, as described above. As the transmission area TA and the pixel area PA may be repeatedly disposed in the display area DA, an image may be displayed to a user via the display area DA of the display device 1, and simultaneously, the display area DA may be recognized as being approximately transparent. The display device 1 may be implemented in such a way that the entire surface of the display area DA may be like a transparent display.

In an alternative embodiment, as shown in FIG. 1B, in the display device 1', a display area DA may include a first display area DA1 and a second display area DA2, and transmission areas TAs may be only in the second display area DA2.

In an embodiment, the second display area DA2 may be an area in which a component, such as a sensor using infrared rays, visible rays, or sound, may be located below the second display area DA2. For example, the transmission area TA may be an area through which light or/and sound that may be output from the component to the outside or proceeds toward the component from the outside may be transmitted. In case that light (e.g., infrared rays) transmits through the second display area DA2, light transmittance may be about 10% or more, more particularly, about 20% or more, about 25% or more, about 50% or more, about 85% or more, or about 90% or more.

The number of pixels disposed in the second display area DA2 per unit area may be less than the number of pixels disposed in the display area DA.

In FIG. 1B, the second display area DA2 may be at a side (e.g., at an upper side) of the display area DA having a rectangular shape. However, embodiments are not limited thereto. In an embodiment, the second display area DA2 may be within the display area DA and may have a circular or polygonal shape. The position of the second display area DA2 and the number of second display areas DA2 may be variously changed.

Also, the shape of the display area DA shown in FIGS. 1A and 1B may not be limited to the rectangular shape and may be a circular shape, an oval shape, or a polygonal shape, such as a triangular or pentagonal shape or the like. In case that the shape of the display area DA may be a circular shape, the substrate 100 may have an approximately circular shape according to the shape of the display area DA.

Hereinafter, an organic light-emitting display device will be described as an example of the display device 1 according to an embodiment. However, the display device according to the disclosure is not limited thereto. In another embodiment, the display device 1 according to the disclosure may be a display device, such as an inorganic light-emitting display device or an inorganic EL display device, or a quantum dot light-emitting display device. For example, an emission layer of a display element in the display device 1 may include an organic material, an inorganic material, quantum dots, an organic material and quantum dots, or an inorganic material and quantum dots.

Figure 2:
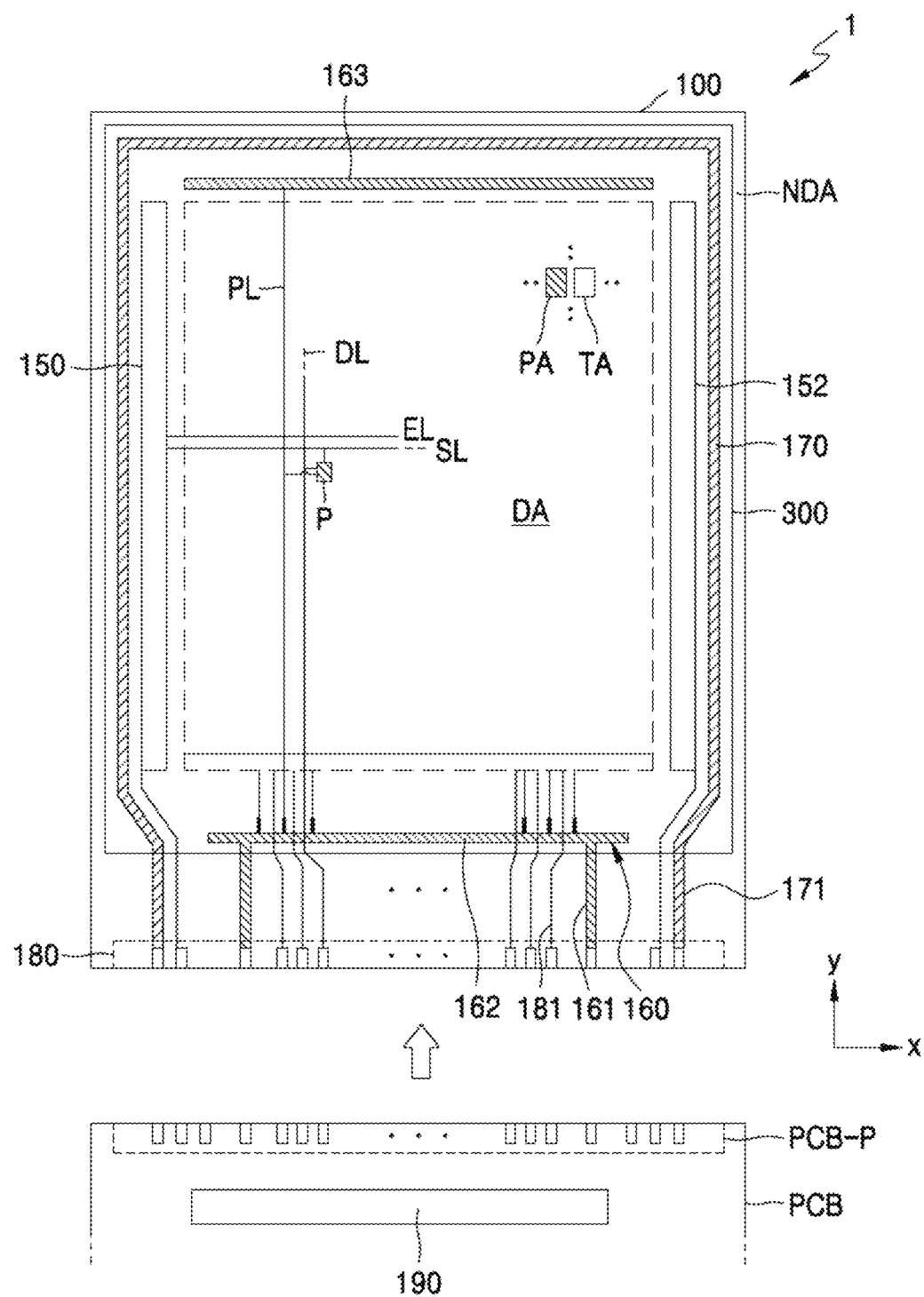
FIG. 2 is a plan view schematically illustrating a display device according to an embodiment.

FIG. 2 is a plan view schematically illustrating a display device according to an embodiment.

Referring to FIG. 2, a variety of components that may constitute the display device 1 may be located on the substrate 100. The substrate 100 may include a glass material, a metal material, a plastic material, or a combination thereof. In case that the substrate 100 includes a plastic material, the substrate 100 may include a polymer resin, such as polyethersulfone, polyacrylate, polyetherimide, polyethylene naphthalate, polyethylene terephthalate, polyphenylene sulfide, polyarylate, polyimide, polycarbonate cellulose acetate propionate, or a combination thereof, for example. The substrate 100 including a plastic material may be flexible, rollable, or bendable.

The substrate 100 may include a display area DA and a non-display area NDA that surrounds the display area DA. The display area DA may be an area in which an image may be displayed on the whole. The display area DA may include a pixel area PA, in which pixels P may be disposed, and a transmission area TA, in which no pixels P may be disposed and which may have a light-transmitting property.

Pixels P may be disposed in the pixel area PA of the display area DA. Each of the pixels P may include a display element, such as an organic light-emitting diode OLED. Each of the pixels P may emit red, green, blue, or white light, for example, from the organic light-emitting diode OLED. Hereinafter, the pixels P in the specification may be (sub-) pixels that emit light having red, green, blue, and white colors, as described above.

The display area DA may be covered by an encapsulation member 300 and protected from external air or moisture. The encapsulation member 300 may be an encapsulation substrate including a glass material and may have a thin-film encapsulation layer including at least one organic layer and at least one inorganic layer that may be alternately stacked. Although not shown, in case that the encapsulation member 300 may be an encapsulation substrate, a sealing material for bonding the substrate 100 to the encapsulation member 300 may be deposited in the non-display area NDA.

The pixels P may be electrically connected to external circuits in the non-display area NDA. A first scan driving circuit 150, a second scan driving circuit 152, a first power supply line 160, a second power supply line 170, a pad part 180, and a data driving circuit 190 may be disposed in the non-display area NDA.

The first scan driving circuit 150 may provide a scan signal to each pixel P through a scan line SL. The first scan driving circuit 150 may provide an emission control signal to each pixel through an emission control line EL. The second scan driving circuit 152 may be located in parallel to the first scan driving circuit 150 with the display area DA therebetween. Some of the pixels P disposed in the display area DA may be electrically connected to the first scan driving circuit 150, and the remaining pixels P may be electrically connected to the second scan driving circuit 152. In another embodiment, the second scan driving circuit 152 may be omitted.

The first power supply line 160 may include a first sub-line 162 and a second sub-line 163, which extend in parallel to each other in an x-direction with the display area DA therebetween. The second power supply line 170 having a loop shape with an open side may surround the display area DA partially.

The pad part 180 may be located at an edge of the substrate 100. The pad part 180 may not be covered by an insulating layer but may be exposed and thus may be electrically connected to a printed circuit board PCB. A pad part PCB-P of the printed circuit board PCB may be electrically connected to the pad part 180 of the display device 1. The printed circuit board PCB may provide signals or power of a controller (not shown) to the display device 1.

Control signals generated in the controller may be respectively transmitted to the first and second scan driving circuits 150 and 152 through the printed circuit board PCB. The controller may provide a first power supply voltage ELVDD and a second power supply voltage ELVSS (see FIG. 3) respectively to the first and second power supply lines 160 and 170 through first and second connection lines 161 and 171. The first power supply voltage ELVDD may be provided to each of the pixels P via a driving voltage line PL electrically connected to the first power supply line 160, and the second power supply voltage ELVSS may be provided to an opposite electrode of each pixel P electrically connected to the second power supply line 170.

The data driving circuit 190 may be electrically connected to the data line DL. A data signal of the data driving circuit 190 may be provided to each pixel P via a connection line 181 electrically connected to the pad part 180 and a data line DL electrically connected to the connection line 181. FIG. 1B illustrates that the data driving circuit 190 may be located at the printed circuit board PCB. In another embodiment, the data driving circuit 190 may be located on the substrate 100. For example, the data driving circuit 190 may be located between the pad part 180 and the first power supply line 160.

Figure 3:
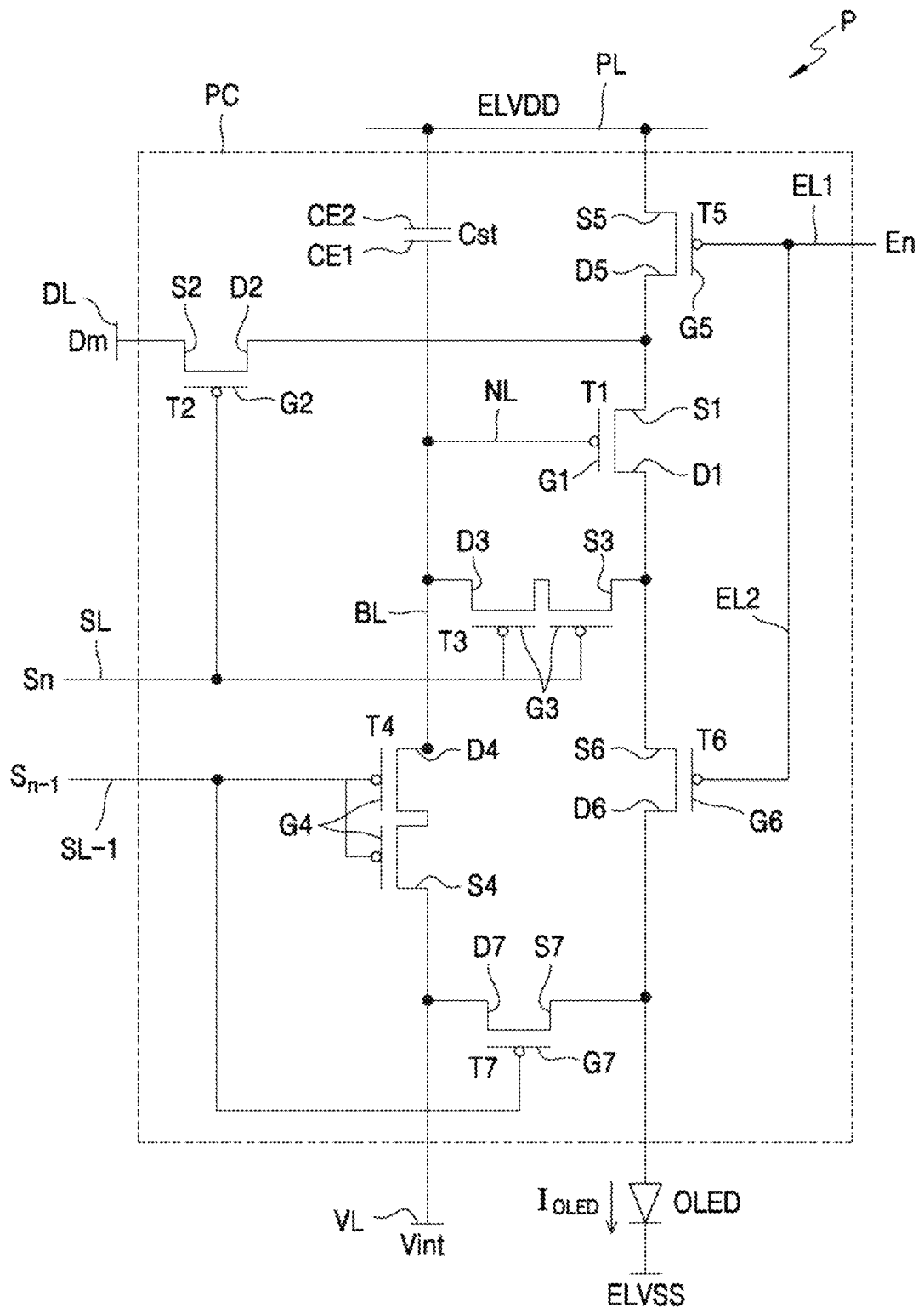
FIG. 3 is an equivalent circuit diagram schematically illustrating a pixel of a display panel according to an embodiment.

FIG. 3 is a circuit diagram schematically illustrating a pixel of a display panel according to an embodiment.

Referring to FIG. 3, each of the pixels P may include a pixel circuit PC and an organic light-emitting diode OLED electrically connected to the pixel circuit PC. The pixel circuit PC may include thin-film transistors and a storage capacitor. The thin-film transistors and the storage capacitor may be electrically connected to signal lines SL, SL-1, EL1, EL2, and DL, an initialization voltage line VL, and the driving voltage line PL.

FIG. 3 illustrates that each pixel P may be electrically connected to the signal lines SL, SL-1, EL1, EL2, and DL, the initialization voltage line VL, and the driving voltage line PL. However, embodiments are not limited thereto. In another embodiment, at least one of the signal lines SL, SL-1, EL1, EL2, and DL, the initialization voltage line VL, and the driving voltage line PL may be shared among neighboring pixels.

The thin-film transistors may include a driving thin-film transistor (TFT) T1, a switching TFT T2, a compensation TFT T3, a first initialization TFT T4, an operation control TFT T5, an emission control TFT T6, and a second initialization TFT T7.

The signal lines may include a scan line SL that may deliver a scan signal Sn, a previous scan line SL-1 that may deliver a previous scan signal Sn-1 to the first initialization TFT T4 and the second initialization TFT T7, a first emission control line EL1 and a second emission control line EL2 that may deliver an emission control signal En to the operation control TFT T5 and the emission control TFT T6, and the data line DL that crosses the scan line SL and may deliver a data signal Dm. The driving voltage line PL may deliver a driving voltage such as the first power supply voltage ELVDD to the driving TFT T1, and the initialization voltage line VL may deliver an initialization voltage Vint to the driving TFT T1 and a pixel electrode of the organic light-emitting diode OLED.

A driving gate electrode G1 of the driving TFT T1 may be electrically connected to a first storage capacitive plate Cst1 of a storage capacitor Cst, and a driving source electrode S1 of the driving TFT T1 may be electrically connected to the driving voltage line PL thereunder via the operation control TFT T5, and a driving drain electrode D1 of the driving TFT T1 may be electrically connected to the pixel electrode of the organic light-emitting diode OLED via the emission control TFT T6. The driving TFT T1 may provide a data signal Dm according to a switching operation of the switching TFT T2 and may supply a driving current $I_{OLED}$ to the organic light-emitting diode OLED.

A switching gate electrode G2 of the switching TFT T2 may be electrically connected to the scan line SL, and a switching source electrode S2 of the switching TFT T2 may be electrically connected to the data line DL, and a switching drain electrode D2 of the switching TFT T2 may be electrically connected to the driving source electrode S1 of the driving TFT T1 and to the driving voltage line PL thereunder via the operation control TFT T5. The switching TFT T2 may be turned on according to the scan signal Sn delivered via the scan line SL and may perform a switching operation of delivering a data signal Dm transmitted to the data line DL to the driving source electrode S1 of the driving TFT T1.

A compensation gate electrode G3 of the compensation TFT T3 may be electrically connected to the scan line SL, a compensation source electrode S3 of the compensation TFT T3 may be electrically connected to the driving drain electrode D1 of the driving TFT T1 and to the pixel electrode of the organic light-emitting diode OLED via the emission control TFT T6, and a compensation drain electrode D3 of the compensation TFT T3 may be electrically connected to the first storage capacitive plate Cst1 of the storage capacitor Cst, a first initialization drain electrode D4 of the first initialization TFT T4, and the driving gate electrode G1 of the driving TFT T1. The compensation TFT T3 may be turned on according to the scan signal Sn provided via the scan line SL and may electrically connect the driving gate electrode G1 to the driving drain electrode D1 of the driving TFT T1, thereby diode-connecting the driving TFT T1.

A first initialization gate electrode G4 of the first initialization TFT T4 may be electrically connected to the previous scan line SL-1, and a first initialization source electrode S4 of the first initialization TFT T4 may be electrically connected to a second initialization drain electrode D7 of the second initialization TFT T7 and the initialization voltage line VL, and the first initialization drain electrode D4 of the first initialization TFT T4 may be electrically connected to the first storage capacitive plate Cst1 of the storage capacitor Cst, the compensation drain electrode D3 of the compensation TFT T3, and the driving gate electrode G1 of the driving TFT T1. The first initialization TFT T4 may be turned on according to the previous scan signal Sn-1 delivered via the previous scan line SL-1 and may perform an initialization operation of delivering the initialization voltage Vint to the driving gate electrode G1 of the driving TFT T1 and initializing a voltage of the driving gate electrode G1 of the driving TFT T1.

An operation control gate electrode G5 of the operation control TFT T5 may be electrically connected to the first emission control line EL1, and an operation control source electrode S5 of the operation control TFT T5 may be electrically connected to the driving voltage line PL thereunder, and an operation control drain electrode D5 of the operation control TFT T5 may be electrically connected to the driving source electrode S1 of the driving TFT T1 and the switching drain electrode D2 of the switching TFT T2.

An emission control gate electrode G6 of the emission control TFT T6 may be electrically connected to the second emission control line EL2, and an emission control source electrode S6 of the emission control TFT T6 may be electrically connected to the driving drain electrode D1 of the driving TFT T1 and the compensation source electrode S3 of the compensation TFT T3, and an emission control drain electrode D6 of the emission control TFT T6 may be electrically connected to the second initialization source electrode S7 of the second initialization TFT T7 and the pixel electrode of the organic light-emitting diode OLED.

The operation control TFT T5 and the emission control TFT T6 may be simultaneously turned on according to the emission control signal En delivered via the second emission control line EL2, and thus, the driving voltage such as the first power supply voltage ELVDD may be delivered to the organic light-emitting diode OLED and the driving current $I_{OLED}$ may flow through the organic light-emitting diode OLED.

A second initialization gate electrode G7 of the second initialization TFT T7 may be electrically connected to the previous scan line SL-1, a second initialization source electrode S7 of the second initialization TFT T7 may be electrically connected to the emission control drain electrode D6 of the emission control TFT T6 and the pixel electrode of the organic light-emitting diode OLED, and a second initialization drain electrode D7 of the second initialization TFT T7 may be electrically connected to the first initialization source electrode S4 of the first initialization TFT T4 and the initialization voltage line VL. The second initialization TFT T7 may be turned on according to the previous scan signal Sn-1 provided via the previous scan line SL-1 and may initialize the pixel electrode of the organic light-emitting diode OLED.

FIG. 3 illustrates that the initialization TFT T4 and the second initialization TFT T7 may be electrically connected to the previous scan line SL-1. However, embodiments are not limited thereto. In another embodiment, the initialization TFT T4 may be electrically connected to the previous scan line SL-1 and driven according to the previous scan signal Sn-1, and the second initialization TFT T7 may be electrically connected to an additional signal line (for example, a subsequent scan line) and driven according to a signal delivered to the signal line.

A second storage capacitive plate Cst2 of the storage capacitor Cst may be electrically connected to the driving voltage line PL, and an opposite electrode of the organic light-emitting diode OLED may be electrically connected to a common voltage such as the second power supply voltage ELVSS. Thus, the organic light-emitting diode OLED may receive the driving current $I_{OLED}$ from the driving TFT T1 to emit light, thereby displaying an image.

FIG. 3 illustrates that the compensation TFT T3 and the initialization TFT T4 may have a dual gate electrode. However, the compensation TFT T3 and the initialization TFT T4 may have one gate electrode.

Figure 4:
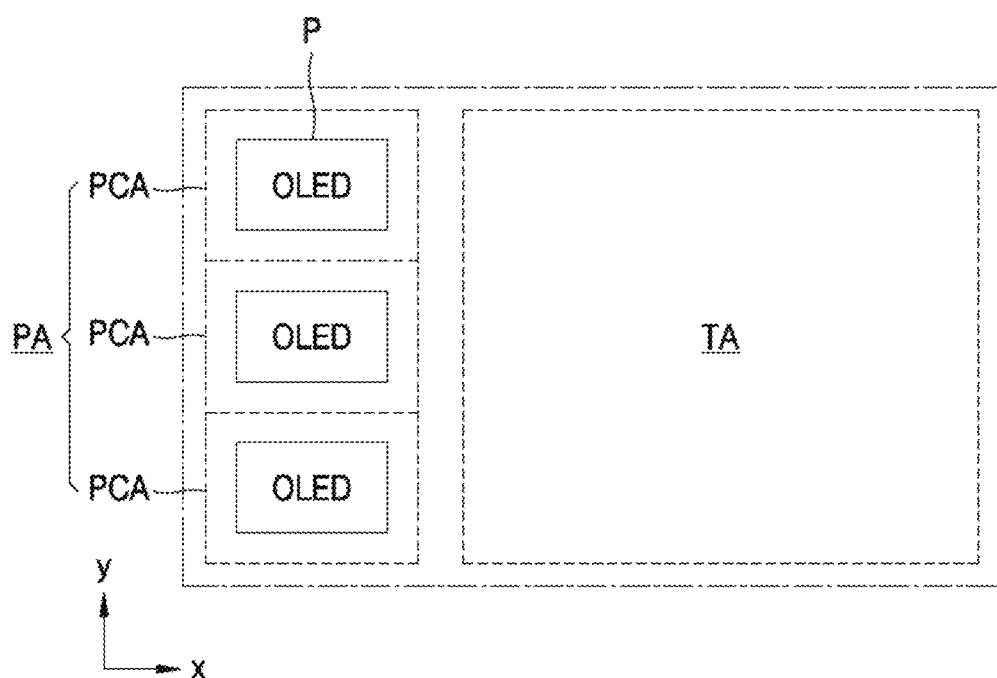
FIG. 4 is a plan view schematically illustrating part of a display device according to an embodiment.

FIG. 4 is a plan view schematically illustrating part of a display device according to an embodiment.

Referring to FIG. 4, the pixel area PA and the transmission area TA may be adjacent to each other. Organic light-emitting diodes OLEDs may be disposed in the pixel area PA. In other words, the pixel area PA may include pixel circuit areas PCAs, and each of the organic light-emitting diodes OLED may correspond to each of the pixel circuit areas PCAs. The pixel circuit (see PC of FIG. 3) including TFTs and the storage capacitor may be located in the pixel circuit areas PCAs, and the pixel circuit PC may be electrically connected to the organic light-emitting diodes OLEDs and thus may drive the pixel (see P of FIG. 3).

FIG. 4 illustrates that the organic light-emitting diodes OLEDs may be located approximately in the center of the pixel circuit areas PCAs. However, embodiments are not limited thereto. In another embodiment, there may be various modifications in which the organic light-emitting diodes OLEDs may be disposed on a side of the pixel circuit areas PCAs or overall in the pixel circuit areas PCAs.

The transmission area TA that may be an area through which external light may be transmitted, may be an area in which no pixel circuit PC and no organic light-emitting diode OLED may be located. No pixel circuit PC means that conductive layers of the pixel circuit PC may not be located in the transmission area TA. In an embodiment, lines that extend in a first direction (x-direction) and/or a second direction (y-direction) may bypass the transmission area TA.

The pixel area PA and the transmission area TA may be in combination. The area of the transmission area TA on a plane may be greater than the area of the pixel area PA. In an embodiment, the transmission area TA may be about 50% or more of the display area DA. Alternatively, the transmission area TA may be about 75% or more of the display area DA. According to an embodiment, a display device in which the transmission area TA may be increased to achieve high transmittance, may be implemented.

Figure 5A:
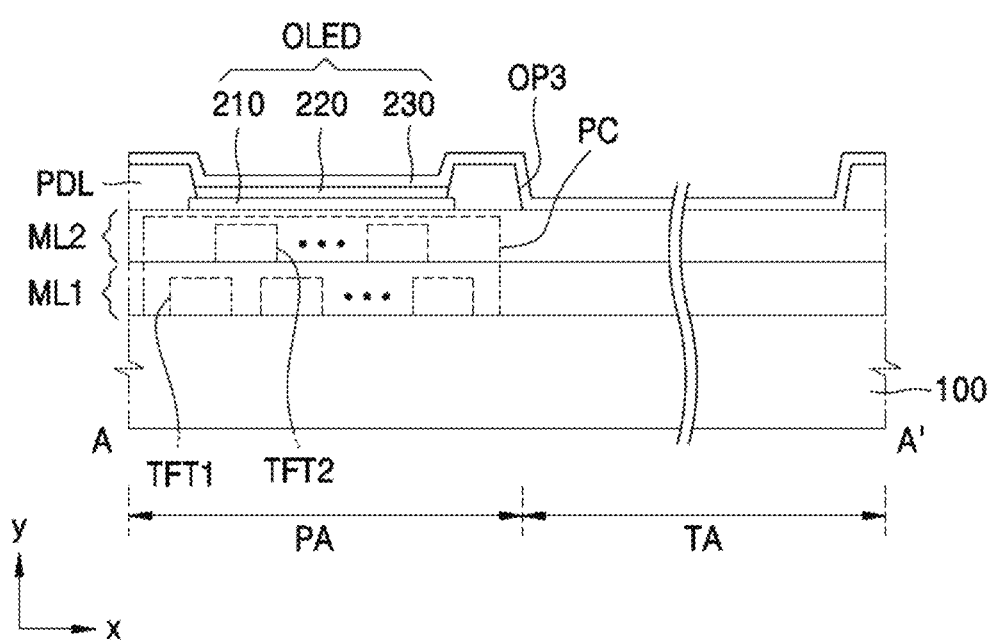
FIGS. 5A through 5D are cross-sectional views schematically illustrating part of display devices according to embodiments.
Figure 5B:
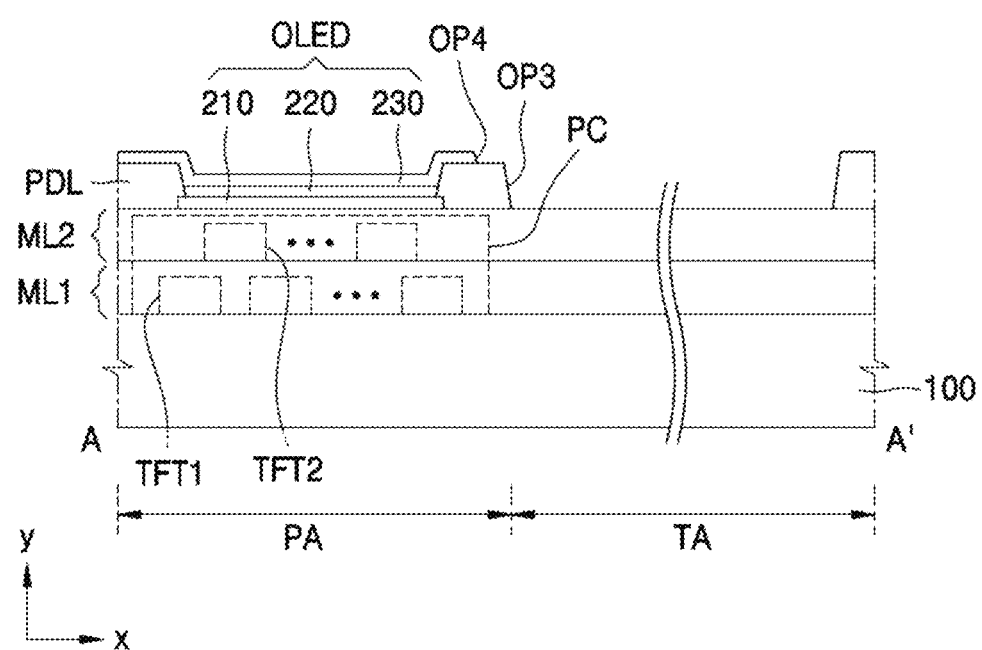

FIGS. 5A through 5D are cross-sectional views schematically illustrating portions of display devices according to embodiments. FIGS. 5A and 5B may correspond to a cross-section taken along line A-A' of FIG. 1A or 1B.

Referring to FIG. 5A, a first multi-layer film ML1 on the substrate 100 and a second multi-layer film ML2 on the first multi-layer film ML1 may be provided in the pixel area PA. A pixel-defining layer PDL and an organic light-emitting diode OLED may be located on the second multi-layer film ML2.

The first multi-layer film ML1 and the second multi-layer film ML2 may have a structure in which insulating layers and conductive layers may be alternately stacked. The pixel circuit PC may be implemented through the insulating layers that may be between patterned conductive layers to insulate them.

A first thin-film transistor TFT1 may be included in the first multi-layer film ML1, and a second thin-film transistor TFT2 may be included in the second multi-layer film ML2. "A thin-film transistor included in a multi-layer film" may mean that part of multiple conductive layers included in the multi-layer film constitute a semiconductor layer, a gate electrode, and a source/drain electrode of the thin-film transistor.

As shown in FIG. 5A, at least one first thin-film transistor TFT1 may be provided in the first multi-layer film ML1. Also, at least one second thin-film transistor TFT2 may be provided in the second multi-layer film ML2.

The pixel circuit PC according to an embodiment includes thin-film transistors. In case that the pixel circuit PC includes seven thin-film transistors and a storage capacitor, as shown in FIG. 3, a certain area may be required so that seven thin-film transistors may be disposed on the substrate 100. In particular, in a transparent display device according to an embodiment, the ratio of the transmission area TA may be increased as the area of the pixel circuit PC may be gradually reduced. Thus, a display device having high transmittance may be implemented.

Thus, in a display device according to an embodiment, thin-film transistors may be disposed in multiple levels (e.g., duplex) so that the area of a pixel circuit including the same number of thin-film transistors may be relatively reduced on the plane. Thus, the same performance of the pixel circuit may be maintained and simultaneously, the area of the pixel circuit PC of each pixel P may be reduced so that a display device having high transmittance may be implemented.

The first multi-layer film ML1 and the second multi-layer film ML2 may extend to the transmission area TA. Referring to FIG. 5A, no thin-film transistors may be located on the portion of the first multi-layer film ML1 and the portion of the second multi-layer film ML2 that extend to the transmission area TA. Although not shown, the first multi-layer film ML1 and the second multi-layer film ML2 in the transmission area TA may include only insulating layers of an inorganic layer and/or an organic layer excluding the conductive layers.

In an embodiment, the pixel-defining layer PDL may have a third transmission opening OP3 that corresponds to the transmission area TA. For example, part of the pixel-defining layer PDL that corresponds to the transmission area TA may be removed.

In another embodiment, an opposite electrode 230 may have a fourth transmission opening OP4 that corresponds to the transmission area TA, as shown in FIG. 5B. For example, part of the opposite electrode 230 that corresponds to the transmission area TA may be removed. In particular, the opposite electrode 230 may be formed of metal and thus the transmittance thereof may be considerably lower than the insulating layers. Thus, in order to improve transmittance per unit area of the transmission area TA, part of the opposite electrode 230 that corresponds to the transmission area TA may be removed.

Figure 5C:
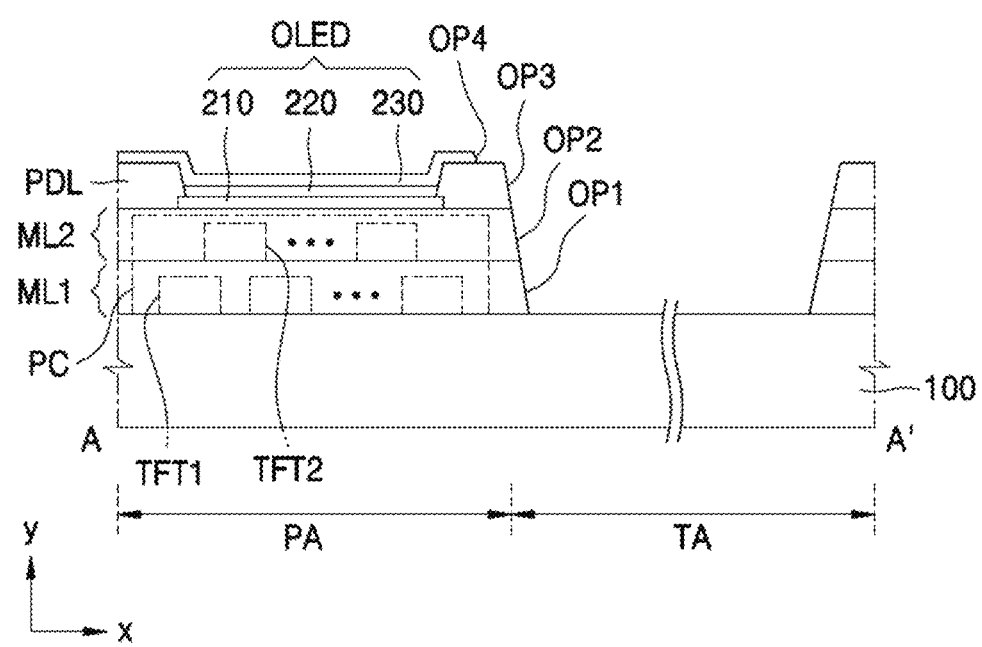

In another embodiment shown in FIG. 5C, the first multi-layer film ML1 and the second multi-layer film ML2 that extend into the transmission area TA may have a first transmission opening OP1 and a second transmission opening OP2, each corresponding to the transmission area TA. In this way, layers in the transmission area TA may be removed so that transmittance per unit area of the transmission area TA may be improved.

FIG. 5C illustrates that a top surface of the substrate 100 may be exposed to the outside through the first transmission opening OP1. However, in some embodiments, a buffer layer may remain on the substrate 100 corresponding to the transmission area TA.

Figure 5D:
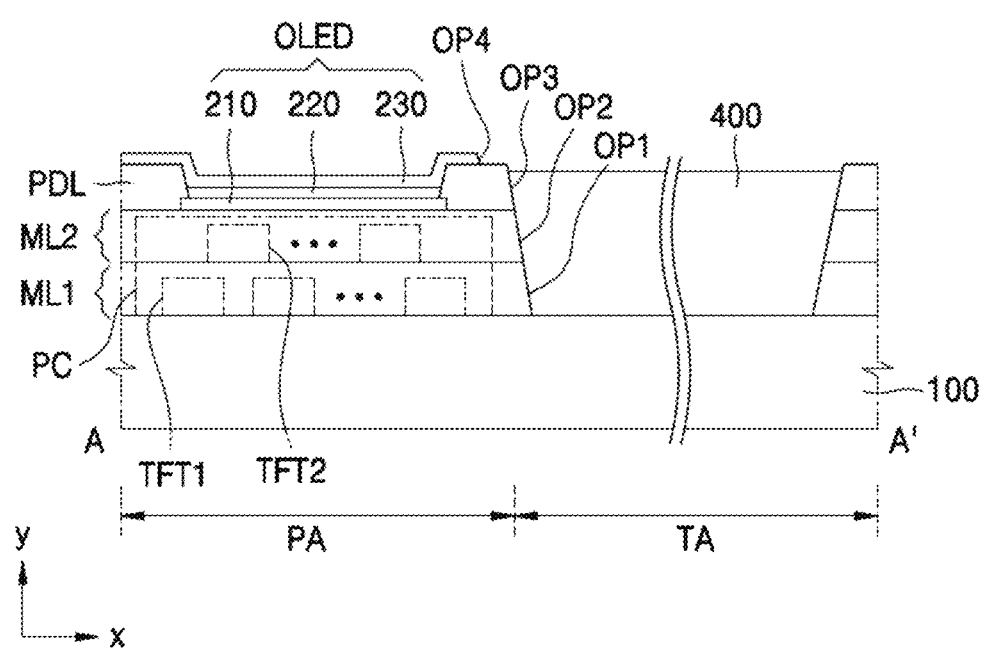

A light-transmitting filling layer 400 may be disposed or filled in the first transmission opening OP1 and the second transmission opening OP2, as shown in FIG. 5D. The light-transmitting filling layer 400 may include silicon oxynitride (SiON) having an excellent light-transmitting property, for example. A top surface of the light-transmitting filling layer 400 may be located on a virtual surface between a top surface of the substrate 100 and a top surface of the pixel-defining layer PDL.

Hereinafter, a detailed structure of the pixel shown in FIG. 3 will be described with reference to FIGS. 6 through 17.

Figure 6:
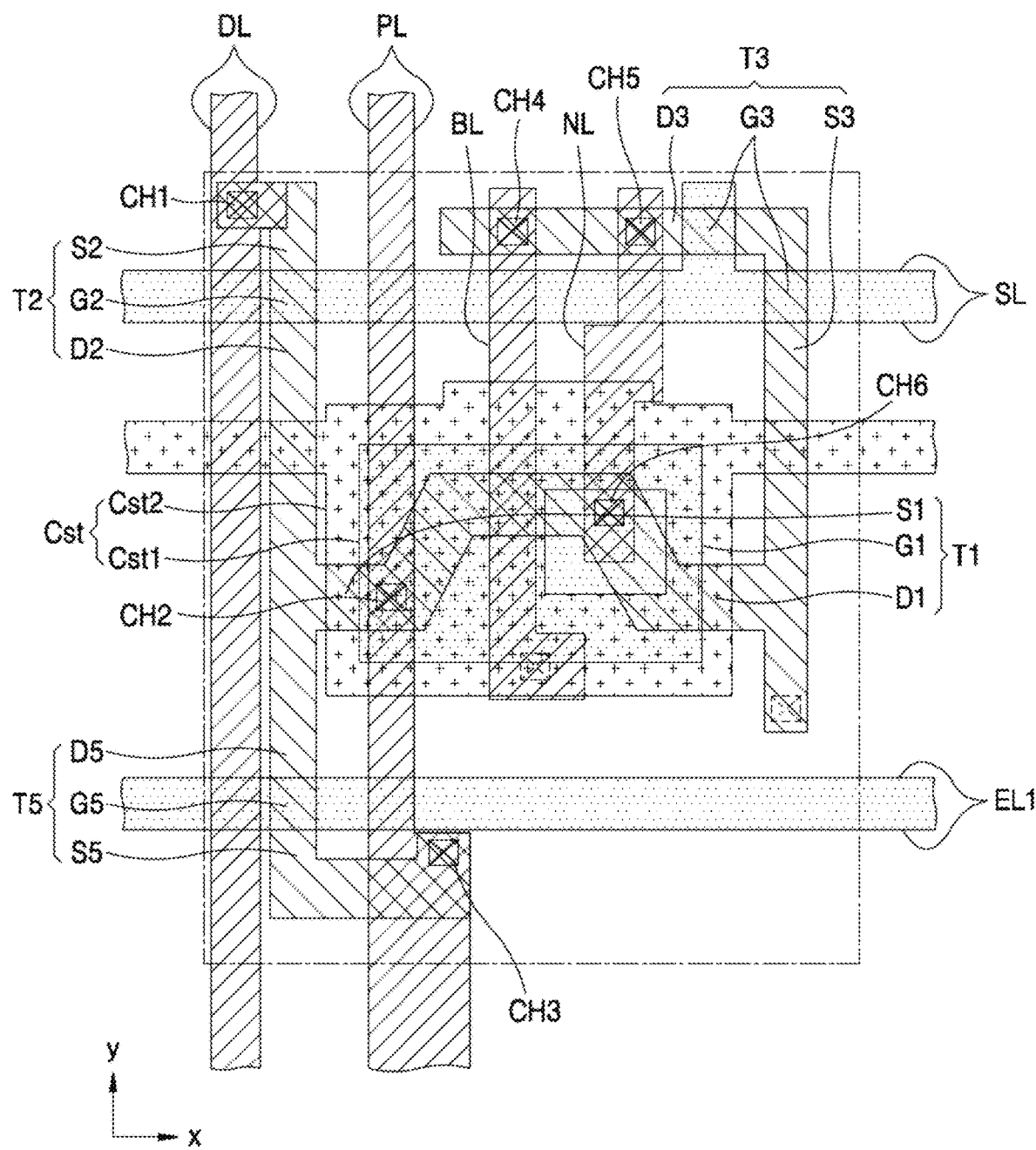
FIG. 6 is a plan view schematically illustrating part of the pixel circuit of FIG. 3.

FIG. 6 is a plan view schematically illustrating part of the thin-film transistors included in the pixel circuit of FIG. 3 and the position of a storage capacitor. FIGS. 7 through 10 are plan views schematically illustrating the layers of FIG. 6.

Figure 11:
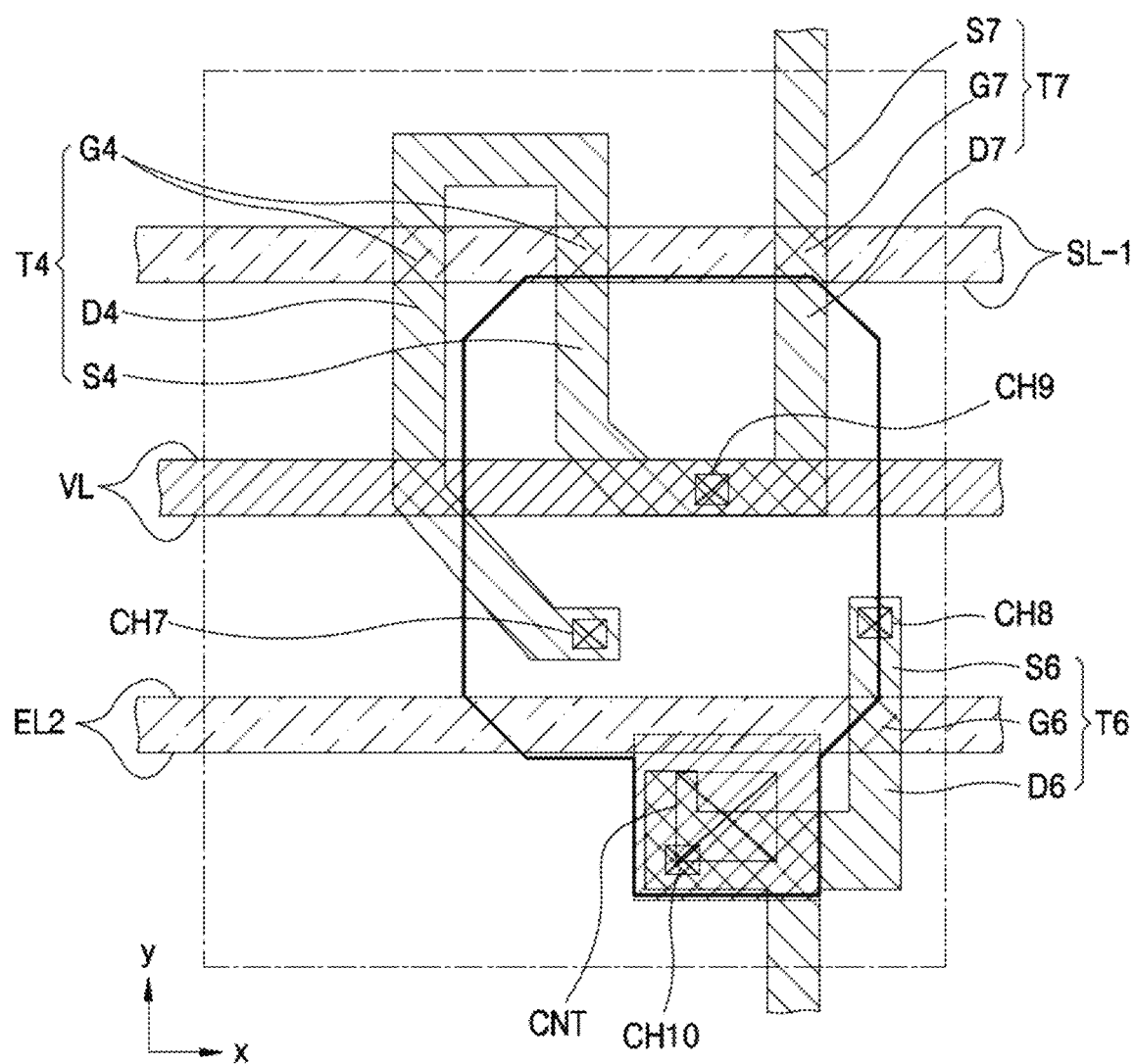
FIG. 11 is a plan view schematically illustrating part of the pixel circuit of FIG. 3.

FIG. 11 is a plan view schematically illustrating a remaining part of the thin-film transistors included in the pixel circuit of FIG. 3 and the position of a pixel electrode. FIGS. 12 through 15 are plan views schematically illustrating the layers of FIG. 11.

Figure 16:
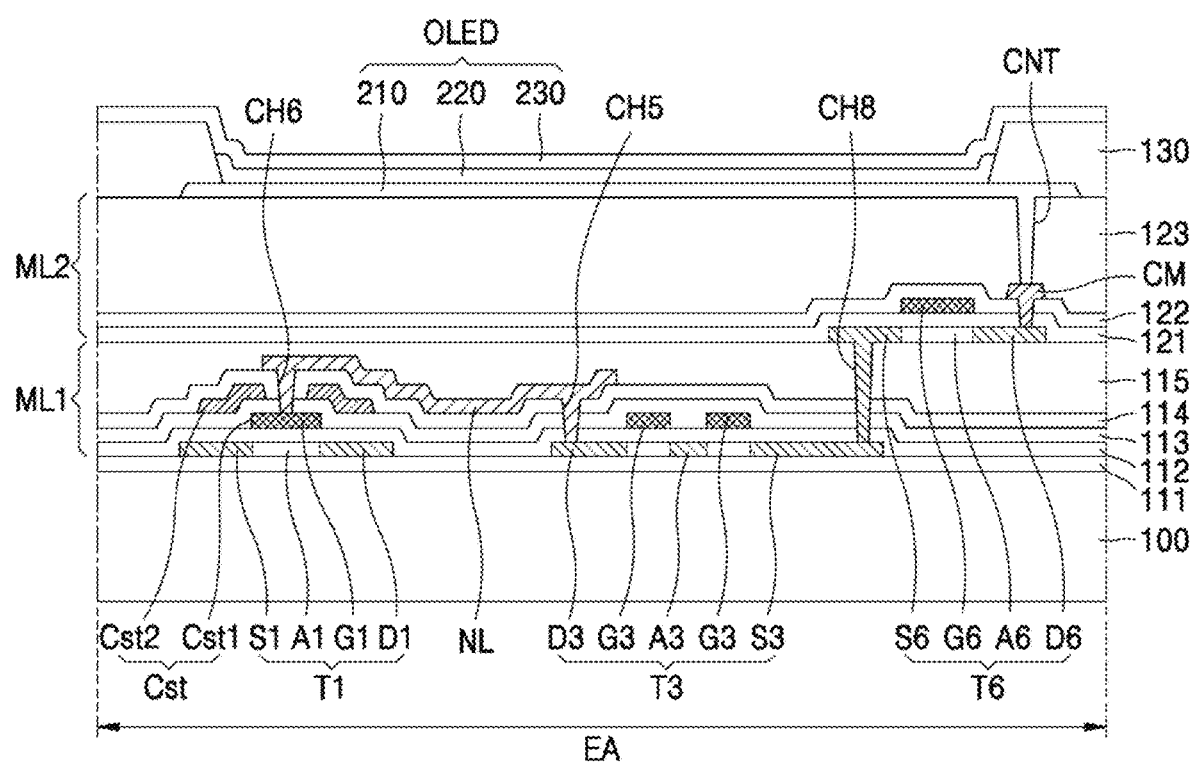
FIGS. 16 and 17 are cross-sectional views schematically illustrating a cross-section of part of a pixel stack structure according to an embodiment.
Figure 17:
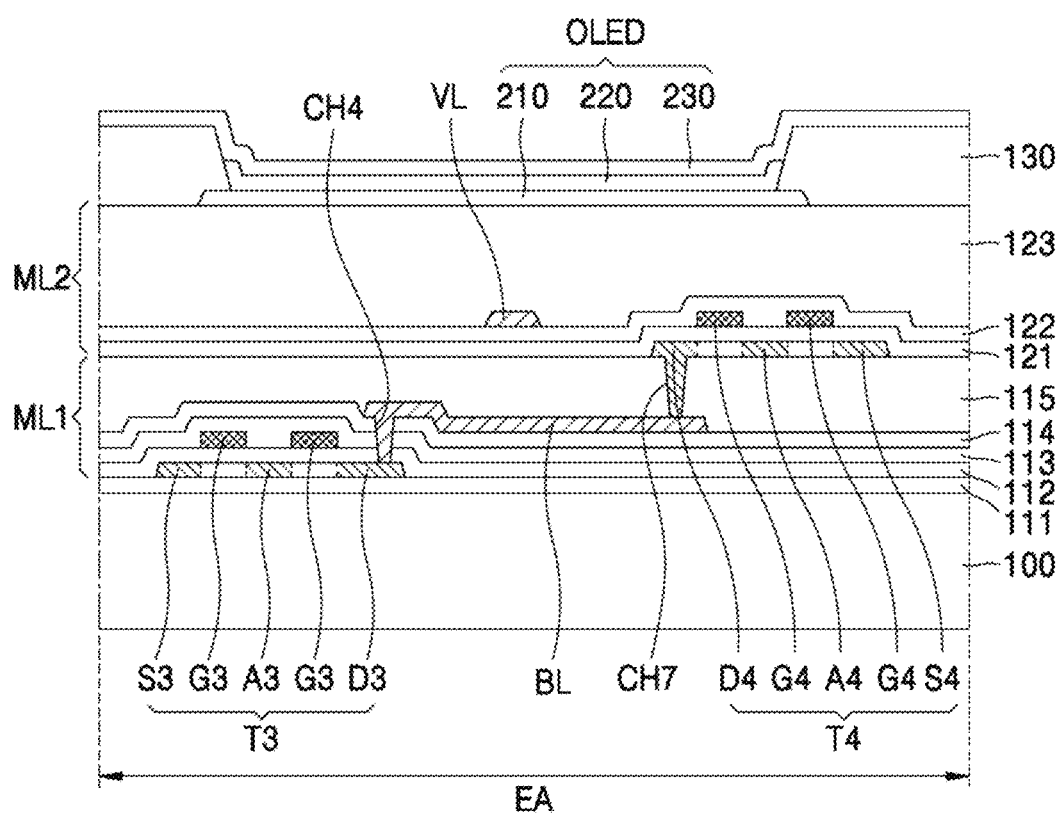

FIGS. 16 and 17 are cross-sectional views schematically illustrating part of a pixel stack structure according to an embodiment.

Figure 12:
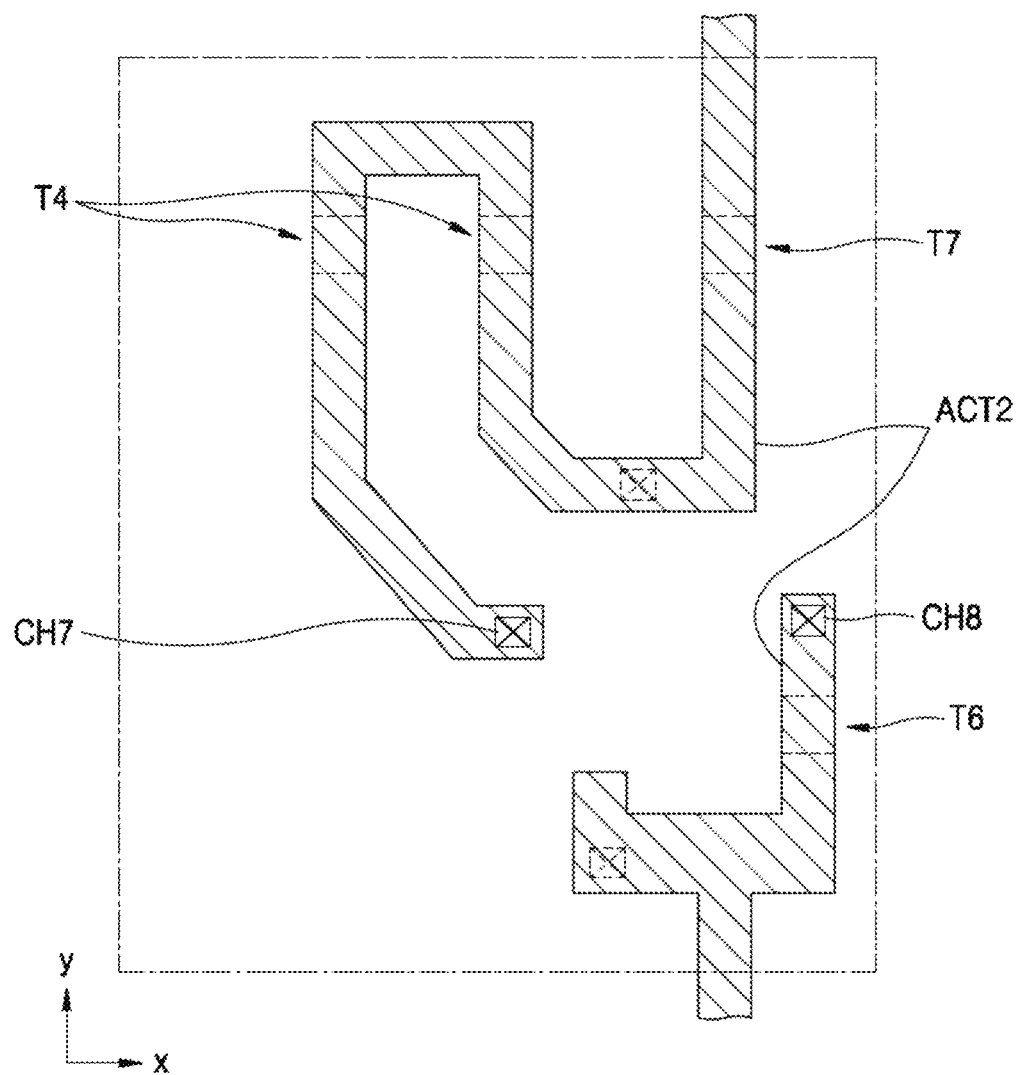
FIGS. 12 through 15 are plan views schematically illustrating layers of FIG. 11.
Figure 13:
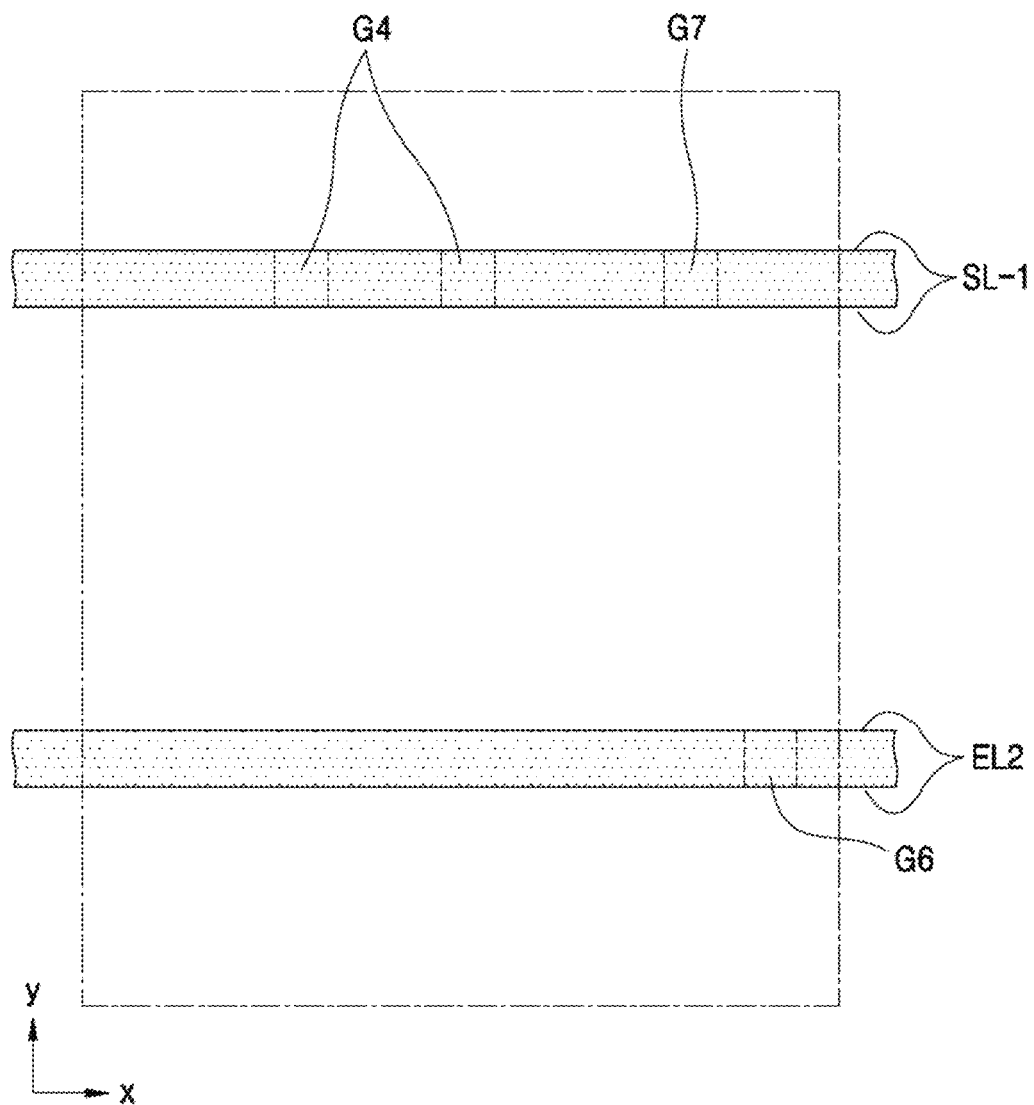
Figure 14:
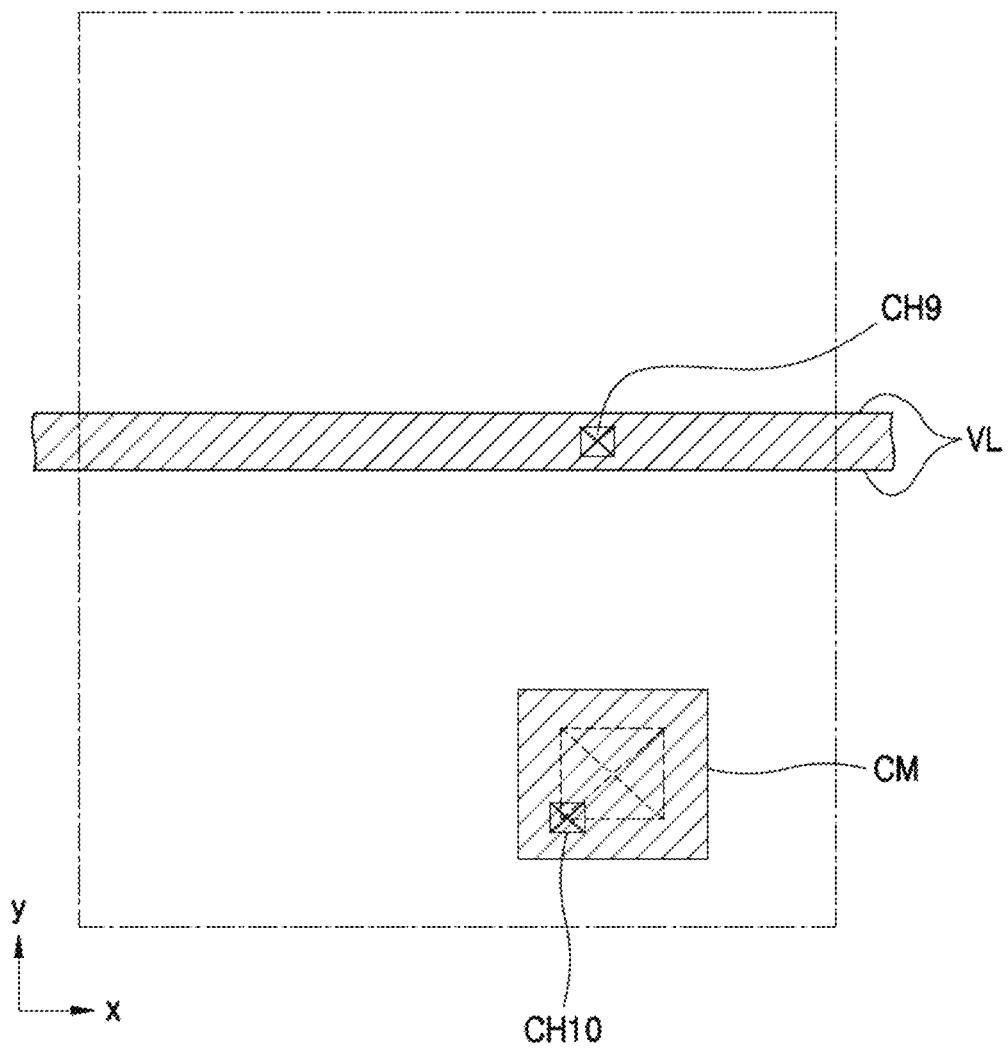
Figure 15:
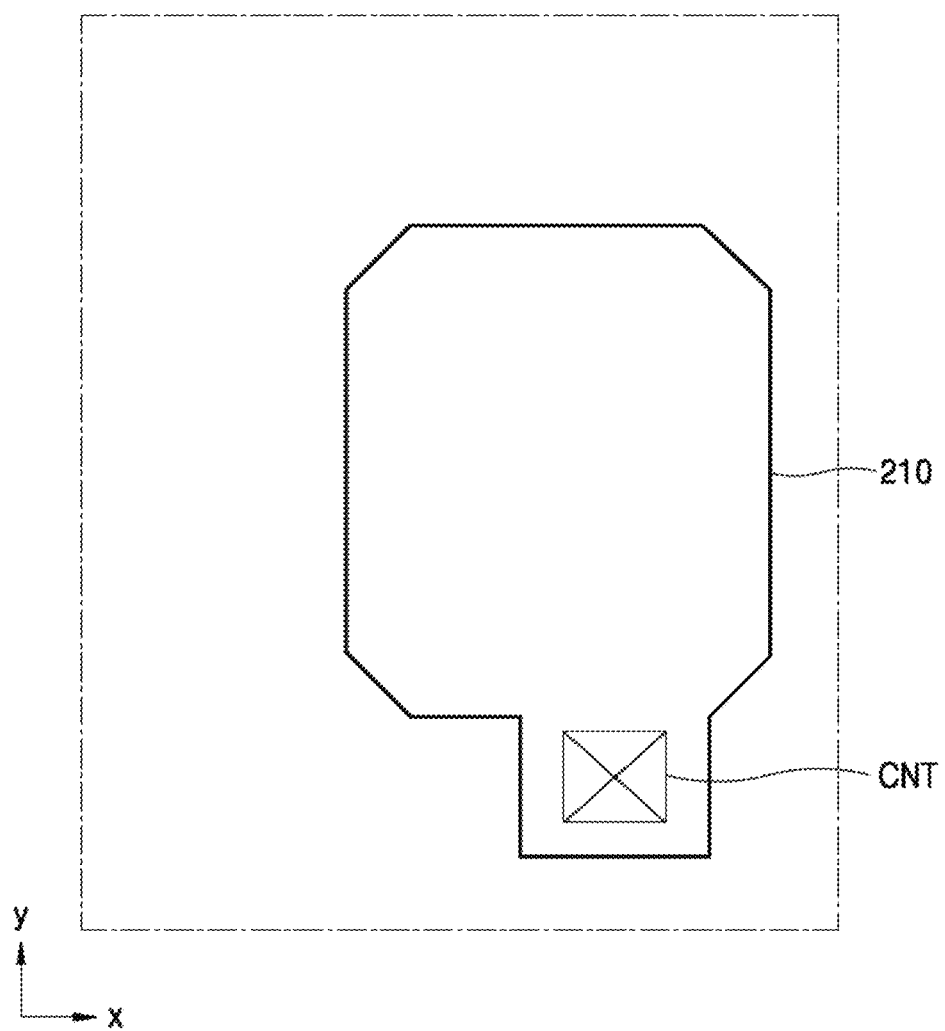

FIG. 6 corresponds to the first multi-layer film ML1, and FIGS. 12 through 14 correspond to the second multi-layer film ML2. That is, structures from FIGS. 12 through 14 may be sequentially stacked on the structure of FIG. 6, and a pixel electrode 210 may be located on the structure of FIG. 14, as shown in FIG. 15.

In an embodiment, the first multi-layer film ML1 of FIG. 6 may include a driving TFT T1, a switching TFT T2, a compensation TFT T3, and an operation control TFT T5. The second multi-layer film ML2 shown in FIGS. 12 through 14 may include a first initialization TFT T4, an emission control TFT T6, and a second initialization TFT T7. The thin-film transistors on the first multi-layer film ML1 and the thin-film transistors on the second multi-layer film ML2 may be electrically connected to one another, and a circuit as schematically shown in FIG. 3 may be constituted.

Each of FIGS. 7 through 10 illustrates the arrangement of lines, electrodes, and semiconductor layers on a same layer. Each of FIGS. 12 through 15 illustrates the arrangement of lines, electrodes, and semiconductor layers on a same layer. The layer corresponding to FIGS. 7 through 10 may be different from the layer corresponding to FIGS. 12 through 15.

An insulating layer may be between the layers shown in FIGS. 7 through 10 and FIGS. 12 through 15. For example, a buffer layer 111 may be between the substrate 100 and the layer of FIG. 7. A first gate insulating layer (see 112 of FIG. 16) may be between the layer of FIG. 7 and the layer of FIG. 8. A first interlayer insulating layer (see 113 of FIG. 16) may be between the layer of FIG. 8 and the layer of FIG. 9. A second interlayer insulating layer (see 114 of FIG. 16) may be between the layer of FIG. 9 and the layer of FIG. 10.

Figure 9:
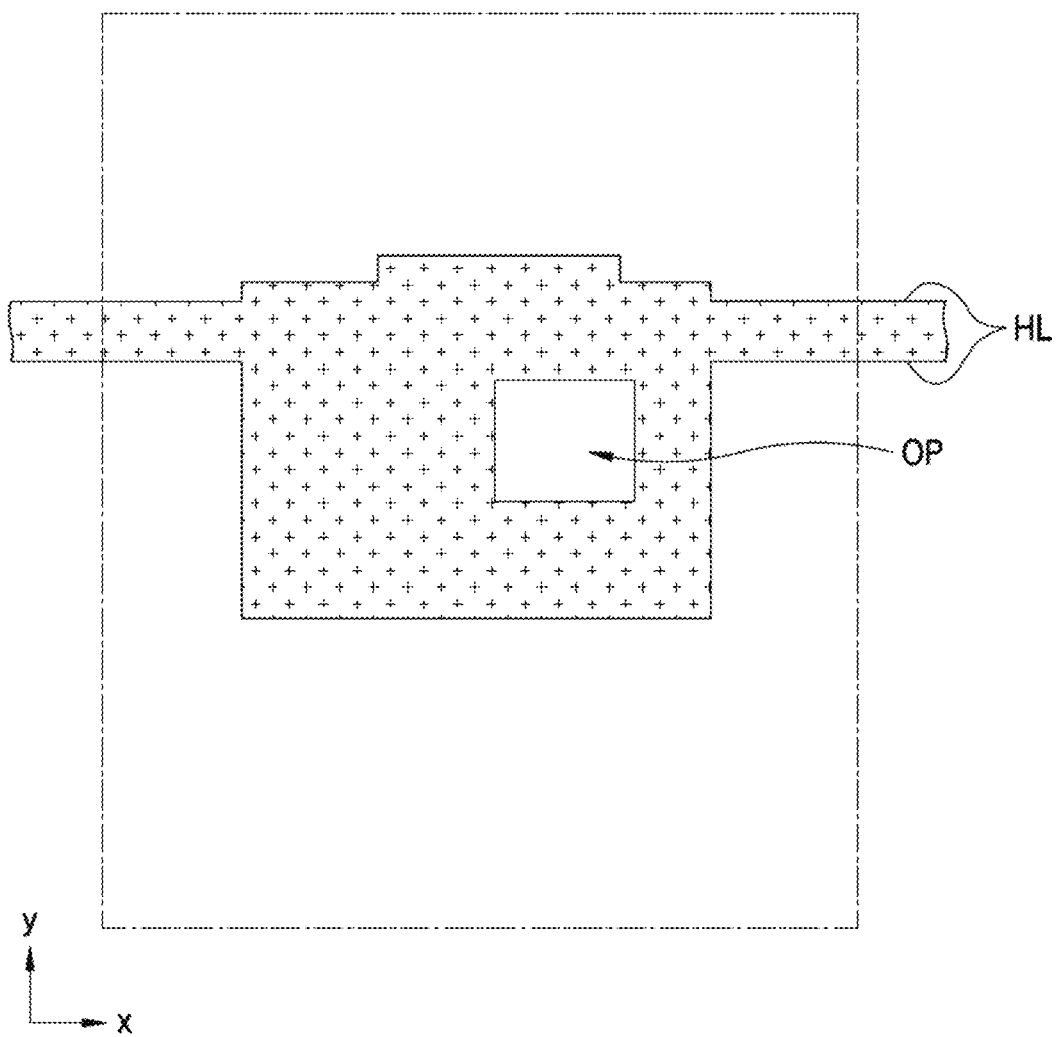
Figure 10:
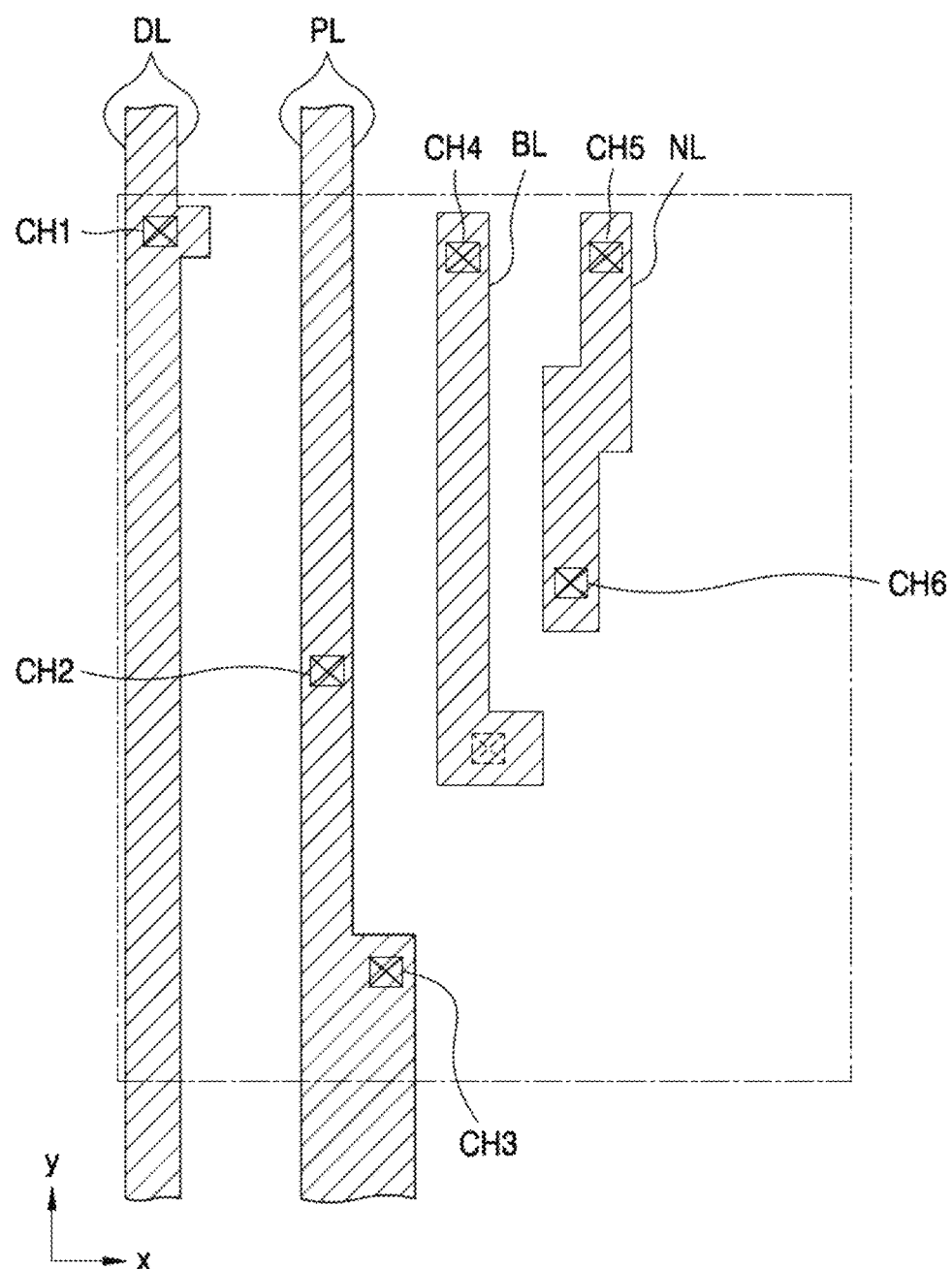

An insulating layer (see 115 of FIG. 16) may be between the layer of FIG. 10 and the layer of FIG. 12. For example, the second multi-layer film ML2 may be located on the insulating layer 115. In this way, the first multi-layer film ML1 according to an embodiment may include the layers shown in FIGS. 7 through 10, the insulating layers, that is, the first gate insulating layer 112, the first interlayer insulating layer 113, and the second interlayer insulating layer 114 therebetween and the insulating layer 115.

Also, a layer shown in FIG. 12 may be located on the first multi-layer film ML1. The layer shown in FIG. 12 may be on (e.g., directly on) the insulating layer 115. A second gate insulating layer (see 121 of FIG. 16) may be between the layer of FIG. 12 and a layer of FIG. 13, and a third interlayer insulating layer (see 122 of FIG. 16) may be between the layer of FIG. 13 and a layer of FIG. 14, and a planarization insulating layer (see 123 of FIG. 16) may be between the layer of FIG. 14 and a layer of FIG. 15. In this way, the second multi-layer film ML2 according to an embodiment may include the layers of FIGS. 12 through 14, the insulating layers, that is, the second gate insulating layer 121 and the third interlayer insulating layer 122 therebetween and the insulating layer 115.

The layers shown in FIGS. 7 through 10 and FIGS. 12 through 15 may be electrically connected to one another via contact holes defined in at least part of the above-described insulating layers.

Referring to FIGS. 6 and 11, the pixel P may include the scan line SL, the previous scan line SL-1, the first emission control line EL1, the second emission control line EL2, and the initialization voltage line VL, which respectively may apply the scan signal Sn, the previous scan signal Sn-1, the emission control signal En, and the initialization voltage Vint and may extend in a first direction (x-direction). The pixel P may include the data line DL and the driving voltage line PL, which may extend in a second direction (y-direction) to cross the scan line SL-1, the first emission control line EL1, the second emission control line EL2, and the initialization voltage line VL and respectively apply a data signal Dm and the driving voltage such as the first power supply voltage ELVDD. The pixel P includes the thin-film transistors T1 through T7, the storage capacitor Cst, and the organic light-emitting diode OLED electrically connected thereto. Hereinafter, for convenience of explanation, description will be provided according to a stack order.

Figure 7:
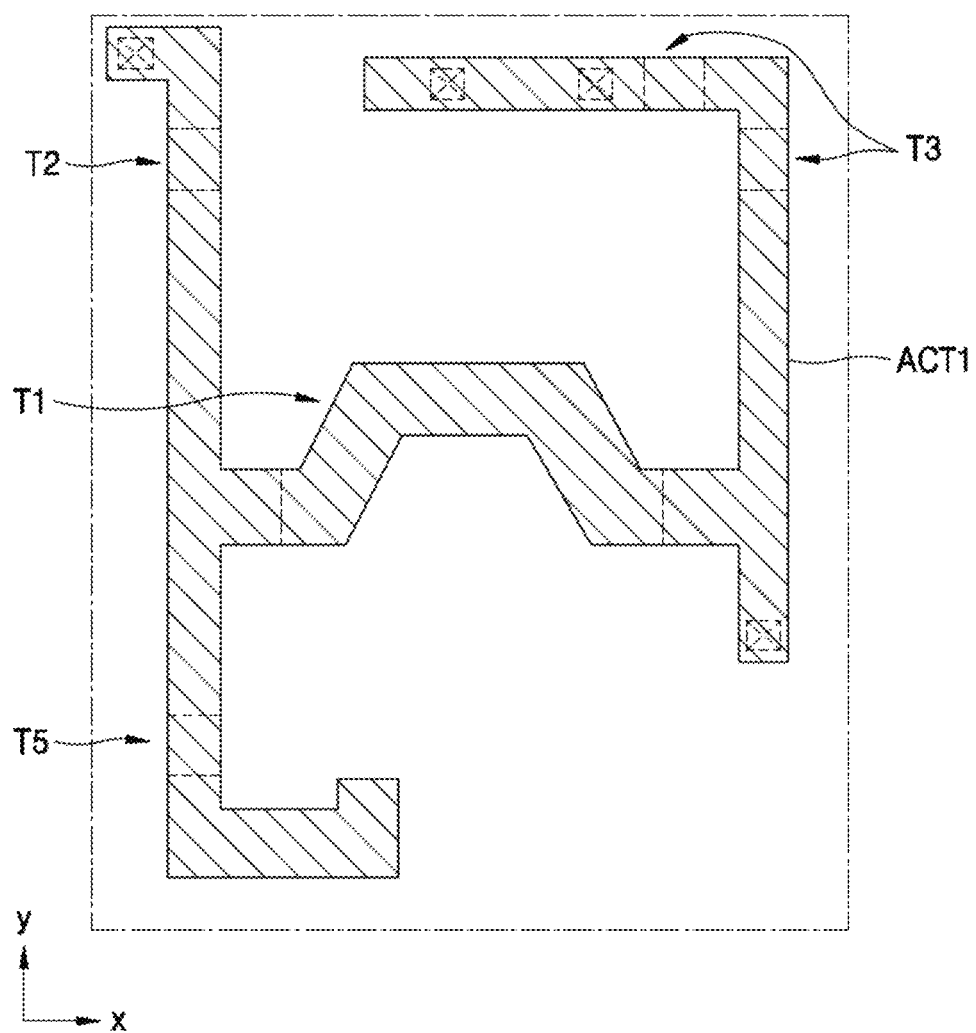
FIGS. 7 through 10 are plan views schematically illustrating layers of FIG. 6.

Referring to FIGS. 6 through 10 and FIGS. 16 and 17, the driving TFT T1, the switching TFT T2, the compensation TFT T3, and the operation control TFT T5 may be disposed along a first active pattern ACT1 shown in FIG. 7. The first active pattern ACT1 may be located on the substrate 100, as shown in FIG. 16, and the buffer layer 111 including an inorganic material, such as silicon oxide ($SiO_x$), silicon nitride ($SiN_x$), and silicon oxynitride (SiON), may be between the first active pattern ACT1 and the substrate 100.

Partial regions of the first active pattern ACT1 may correspond to semiconductor layers of the driving TFT T1, the switching TFT T2, the compensation TFT T3 and the operation control TFT T5, respectively. In other words, the semiconductor layers of the driving TFT T1, the switching TFT T2, the compensation TFT T3, and the operation control TFT T5 may be electrically connected to one another and may be bent in various shapes.

The first active pattern ACT1 may be formed of polycrystalline silicon. Alternatively, the first active pattern ACT1 may include amorphous silicon or an oxide semiconductor layer, such as a G-I-Z-O layer [$(In_2O_3)a(Ga_2O_3)b(ZnO)c$ layer] (where a, b, and c may be real numbers satisfying the condition of a≥0, b≥0, and c>0). Hereinafter, in an embodiment, the case where the first active pattern ACT1 may be formed of polycrystalline silicon will be described.

Hereinafter, each of the first active pattern ACT1 and a second active pattern ACT2 of FIGS. 7 and 12 may include a channel area and source and drain areas in both sides of the channel area. The source area and the drain area may be understood as a source electrode and a drain electrode of the thin-film transistor. Hereinafter, for convenience, the source area and the drain area may be referred to as the source electrode and the drain electrode, respectively.

The driving TFT T1 may include a driving gate electrode G1 that overlaps a driving channel area and a driving source electrode S1 and a driving drain electrode D1 at both sides of the driving channel area. The driving channel area that overlaps the driving gate electrode G1 may have a bent shape, like the letter "S" or an omega shape and thus may constitute a large channel length within a narrow space. In case that the length of the driving channel area may be large, a driving range of a gate voltage may be widened so that a gray scale of light emitted from the organic light-emitting diode OLED may be more precisely controlled and display quality may be improved.

The switching TFT T2 may include a switching gate electrode G2 that overlaps a switching channel area and a switching source electrode S2 and a switching drain electrode D2 at both sides of the switching channel area. The switching drain electrode D2 may be electrically connected to the driving source electrode S1.

The compensation TFT T3 that may be a dual TFT may include compensation gate electrodes G3 that overlap two compensation channel areas and a compensation source electrode S3 and a compensation drain electrode D3, which may be located at both sides of the two compensation channel areas. The compensation TFT T3 may be electrically connected to the driving gate electrode G1 of the driving TFT T1 via a node connection line NL that will be described later.

The operation control TFT T5 may include an operation control gate electrode G5 that overlaps an operation control channel area and an operation control source electrode S5 and an operation control drain electrode D5, which may be located at both sides of the operation control channel area. The operation control drain electrode D5 may be electrically connected to the driving source electrode S1.

The thin-film transistors described above may be electrically connected to the signal lines SL, EL1, and DL, the initialization voltage line VL, and the driving voltage line PL.

Figure 8:
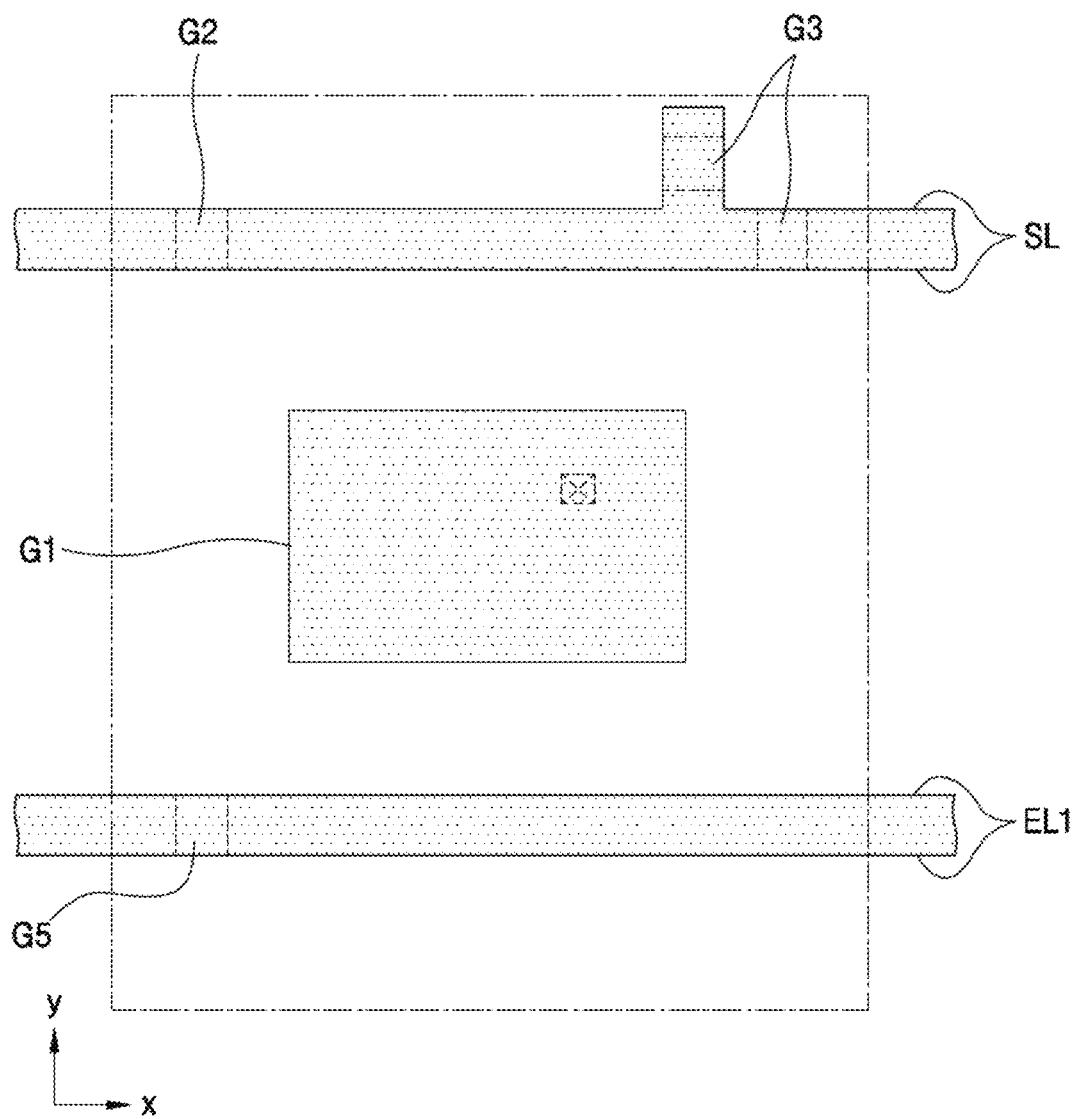

The first gate insulating layer 112 may be located on the first active pattern ACT1 described above, and the scan line SL, the first emission control line EL1, and the driving gate electrode G1 may be located on the first gate insulating layer 112, as shown in FIG. 8. The first gate insulating layer 112 may include an inorganic material, such as silicon oxide (SiO$_x$), silicon nitride (SiN$_x$), silicon oxynitride (SiON), or a combination thereof. The scan line SL, the first emission control line EL1, and the driving gate electrode G1 may include metal, such as molybdenum (Mo), aluminum (Al), copper (Cu), titanium (Ti), and an alloy thereof.

The scan line SL may extend in the x-direction. Certain areas of the scan line SL may correspond to the switching and compensation gate electrodes G2 and G3. For example, areas of the scan line SL that overlap the channel areas of the switching and compensation TFTs T2 and T3 may be switching and compensation gate electrodes G2 and G3, respectively.

The first emission control line EL1 extends in the x-direction. Certain areas of the first emission control line EL1 may correspond to the operation control gate electrode G5. For example, an area of the first emission control line EL1 that overlaps the channel areas of the operation control driving TFT T5 may be the operation control gate electrode G5.

The driving gate electrode G1 that may be a floating electrode may be electrically connected to the compensation TFT T3 via a node connection line (see NL of FIG. 10).

An electrode voltage line HL may be located on the scan line SL, the first emission control line EL1, and the driving gate electrode G1 described above, with the first interlayer insulating layer 113 including an inorganic material and being therebetween, as shown in FIG. 9.

The electrode voltage line HL may extend in the x-direction to cross the data line DL and the driving voltage line PL, as shown in FIG. 9. Part of the electrode voltage line HL may cover at least part of the driving gate electrode G1 and may constitute the storage capacitor Cst together with the driving gate electrode G1. In an embodiment, the driving gate electrode G1 may be the first storage capacitive plate Cst1 (i.e., a lower electrode) of the storage capacitor Cst, and part of the electrode voltage line HL may be the second storage capacitive plate Cst2 (i.e., an upper electrode) of the storage capacitor Cst. In other words, the electrode voltage line HL and the second storage capacitive plate Cst2 may be integrally provided.

The electrode voltage line HL and the second storage capacitive plate Cst2 may be electrically connected to the driving voltage line PL. In this regard, FIG. 6 illustrates that the electrode voltage line HL may be electrically connected to the driving voltage line PL on the electrode voltage line HL via a second contact hole (see CH2 of FIG. 10). The electrode voltage line HL and the driving voltage line PL may have a same voltage level (a constant voltage, for example, +5 V). The electrode voltage line HL may be understood as a type of transverse driving voltage line.

Because the driving voltage line PL extends in the y-direction, and the electrode voltage line HL electrically connected to the driving voltage line PL extends in the x-direction crossing the y-direction, the driving voltage lines PL and the electrode voltage lines HL in the display area DA may constitute a mesh structure.

First conductive layers, such as the data line DL, the driving voltage line PL, a bridge connection line BL, and the node connection line NL may be located on the second storage capacitive plate Cst2 and the electrode voltage line HL with the second interlayer insulating layer 114 including an inorganic material, therebetween, as shown in FIG. 10. The data line DL, the driving voltage line PL, the bridge connection line BL, and the node connection line NL may include Al, Cu, Ti, or a combination thereof, for example. The data line DL, the driving voltage line PL, the bridge connection line BL, and the node connection line NL may have a multi-layer or single layer structure. In an embodiment, the driving voltage line PL and the data line DL may have a multi-layer structure of Ti/Al/Ti.

The data line DL may extend in the y-direction and may be electrically connected to the switching source electrode S2 of the switching TFT T2 via a first contact hole CH1. Part of the data line DL may be understood as a switching source electrode (i.e., an electrode layer).

The driving voltage line PL may extend in the y-direction and may be electrically connected to the electrode voltage line HL via a second contact hole CH2. Also, the driving voltage line PL may be electrically connected to the operation control TFT T5 via a third contact hole CH3. The driving voltage line PL may be electrically connected to the operation control drain electrode D5 via the third contact hole CH3.

An end of the bridge connection line BL may be electrically connected to the first active pattern ACT1 via a fourth contact hole CH4, and another end of the bridge connection line BL may be electrically connected to the second active pattern ACT2 via a seventh contact hole CH7 that will be described later. For example, the first active pattern ACT1 and the second active pattern ACT2 in different layers may be electrically connected to each other via the bridge connection line BL. For example, an end of the bridge connection line BL may be electrically connected to the compensation drain electrode D3, and another end of the bridge connection line BL may be electrically connected to the first initialization drain electrode D4.

An end of the node connection line NL may be electrically connected to the compensation drain electrode D3 via a fifth contact hole CH5, and another end of the node connection line NL may be electrically connected to the driving gate electrode G1 via a sixth contact hole CH6.

The insulating layer 115 may be located on the data line DL, the driving voltage line PL, the bridge connection line BL, and the node connection line NL. The insulating layer 115 may include an inorganic insulating material, such as silicon oxide ($SiO_x$), silicon nitride ($SiN_x$), silicon oxynitride (SiON), or a combination thereof, and/or an organic insulating material, such as acryl, benzocyclobutene (BCB), polyimide, hexamethyldisiloxane (HMDSO), or a combination thereof.

The layers shown in FIG. 11 may be located on the insulating layer 115. FIG. 11 illustrates that the second multi-layer film ML2 including the layers of FIGS. 12 through 14 and the pixel electrode shown in FIG. 15 may be sequentially stacked.

Referring to FIGS. 11 through 17 together, the first initialization TFT T4, the emission control TFT T6, and the second initialization TFT T7 may be located along the second active pattern ACT2 shown in FIG. 12. The second active pattern ACT2 may be located on the insulating layer 115, i.e., the first multi-layer film ML1, as shown in FIG. 16.

Partial areas of the second active pattern ACT2 correspond to the semiconductor layers of the first initialization TFT T4, the emission control TFT T6, and the second initialization TFT T7, respectively. In other words, the semiconductor layers of the first initialization TFT T4, the emission control TFT T6, and the second initialization TFT T7 may be connected to one another and may be bent in various shapes.

As described above, the first active pattern ACT1 and the second active pattern ACT2 may be electrically connected to each other via the bridge connection line BL.

The second active pattern ACT2 may be formed of polycrystalline silicon. Alternatively, the second active pattern ACT2 may include amorphous silicon or an oxide semiconductor layer, such as a G-I-Z-O layer [$(In_2O_3)a(Ga_2O_3)b(ZnO)c$ layer] (where a, b, and c may be real numbers satisfying the condition of a≥0, b≥0, and c>0).

The first initialization TFT T4 that may be a dual TFT may include the first initialization gate electrode G4 that overlaps two first initialization channel areas and a first initialization source electrode S4 and a first initialization drain electrode D4, which may be located at both sides of the two first initialization channel areas.

The emission control TFT T6 may include an emission control gate electrode G6 that overlaps an emission control channel area and an emission control source electrode S6 and an emission control drain electrode D6, which may be located at both sides of the emission control channel area. The emission control source electrode S6 may be electrically connected to the driving drain electrode D1.

The second initialization TFT T7 may include a second initialization gate electrode G7 that overlaps a second initialization channel area and a second initialization source electrode S7 and a second initialization drain electrode D7, which may be located at both sides of the second initialization channel area.

In an embodiment, the second active pattern ACT2 may be electrically connected to the first active pattern ACT1 located under the second active pattern ACT2. In an embodiment, the second active pattern ACT2 may be in contact with an end of the bridge connection line BL located under the second active pattern ACT2 via the seventh contact hole CH7, and the other end of the bridge connection line BL may be in contact with the first active pattern ACT1 located under the second active pattern ACT2 via the fourth contact hole CH4. Also, the second active pattern ACT2 may be in contact with the first active pattern ACT1 located under the second active pattern ACT2 via an eighth contact hole CH8. For example, the emission control source electrode S6 and the compensation source electrode S3 may be electrically connected to each other via the eighth contact hole CH8.

The thin-film transistors described above may be electrically connected to the signal lines SL-1 and EL2 and the initialization voltage line VL.

The second gate insulating layer 121 may be located on the second active pattern ACT2 described above, and the previous scan line SL-1 and the second emission control line EL2 may be located on the second gate insulating layer 121, as shown in FIG. 13. The second gate insulating layer 121 may include an inorganic material, such as silicon oxide ($SiO_x$), silicon nitride ($SiN_x$), silicon oxynitride (SiON), or a combination thereof. The previous scan line SL-1 and the second emission control line EL2 may include metal, such as Mo, Al, Cu, Ti, and an alloy thereof.

The previous scan line SL-1 and the second emission control line EL2 may include metal, such as Mo, Al, Cu, Ti, and an alloy thereof. In an embodiment, the previous scan line SL-1, the second emission control line EL2, the scan line SL, the first emission control line EL1, and the driving gate electrode G1 may include the same materials. Materials of the scan line SL, the first emission control line EL1, and the driving gate electrode G1 may be described above.

The previous scan line SL-1 may extend in the x-direction, and partial areas of the previous scan line SL-1 may correspond to the first and second initialization gate electrodes G4 and G7. For example, areas of the previous scan line SL-1 that overlap the channel areas of the first and second initialization driving TFTs T4 and T7 may be the first and second initialization gate electrodes G4 and G7, respectively.

The second emission control line EL2 may extend in the x-direction. Certain areas of the second emission control line EL2 may correspond to the emission control gate electrode G6. For example, an area of the second emission control line EL2 that overlaps the channel areas of the emission control driving TFT T6 may be the emission control gate electrode G6.

The second conductive layers, i.e., the initialization voltage line VL and the contact metal CM may be located on the previous scan line SL-1 and the second emission control line EL2 described above, with the third interlayer insulating layer 122 between the second conductive layers, the third interlayer insulating layer 122 including an inorganic material, as shown in FIG. 14.

The initialization voltage line VL extends in the x-direction. The initialization voltage line VL may be electrically connected to the first and second initialization TFTs T4 and T7 via a ninth contact hole CH9. In an embodiment, the initialization voltage line VL may be electrically connected to the first initialization source electrode S4 and the second initialization drain electrode D7 via the ninth contact hole CH9.

As shown in FIG. 16, the contact metal CM may connect the emission control TFT T6 to the pixel electrode 210. The contact metal CM may include metal, such as Mo, Al, Cu, Ti, and an alloy thereof. In an embodiment, the contact metal CM may have a triple layer of Ti/Al/Ti. In an embodiment, the contact metal CM, the data line DL, the driving voltage line PL, the bridge connection line BL, and the node connection line NL may include a same material. The data line DL, the driving voltage line PL, the bridge connection line BL, and the node connection line NL may be shown in FIG. 10.

The planarization insulating layer 123 may be located on the initialization voltage line VL and the contact metal CM, and the pixel electrode 210 may be located on the planarization insulating layer 123. The pixel electrode 210 may be electrically connected to the contact metal CM thereunder via a contact hole CNT formed in the planarization insulating layer 123 and thus may be electrically connected to the pixel circuit PC.

Referring to FIGS. 15 through 17, the pixel electrode 210 may be located on the planarization insulating layer 123. The pixel electrode 210 may be electrically connected to the emission control drain electrode D6 of the emission control TFT T6 via the contact metal CM.

The pixel electrode 210 may be a reflective electrode. For example, the pixel electrode 210 may include a reflective layer including silver (Ag), magnesium (Mg), Al, platinum (Pt), palladium (Pd), gold (Au), nickel (Ni), neodymium (Nd), iridium (Ir), chromium (Cr), and a compound thereof and a transparent or semi-transparent electrode layer formed on the reflective layer. The transparent or semi-transparent electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO).

A pixel-defining layer 130 for exposing the pixel electrode 210 may be located on the pixel electrode 210. The pixel-defining layer 130 may include one or more organic insulating materials of polyimide, polyamide, acryl resin, BCB, and phenol resin. The pixel-defining layer 130 covers ends of the pixel electrode 210 and has an opening for exposing at least part of a top surface of the pixel-defining layer 130. An emission area of the pixel P may be defined by the opening of the pixel-defining layer 130.

An intermediate layer 220 may be disposed on the pixel electrode 210 exposed through the opening of the pixel-defining layer 130. The intermediate layer 220 may include a polymer or small molecular weight organic material that emits light with a certain color. The intermediate layer 220 may include an emission layer EML. The intermediate layer 220 shown in FIGS. 16 and 17 may refer to an emission layer.

Although not shown, in an embodiment, the intermediate layer 220 may include a first functional layer under the emission layer and/or a second functional layer on the emission layer.

The first functional layer may have a single layer or multi-layer structure. For example, in case that the first functional layer includes a polymer material, the first functional layer that may be a hole transport layer (HTL) having a single layer structure may include poly-(3,4)-ethylene-dihydroxy thiophene (PEDOT) or polyaniline (PANI). In case that the first functional layer includes a small molecular weight material, the first functional layer may include a hole injection layer (HIL) and a hole transport layer (HTL).

The second functional layer may not necessarily be provided. For example, in case that the first functional layer and the emission layer include a polymer material, the second functional layer may be provided so that the characteristics of an organic light-emitting diode OLED are excellent. The second functional layer may have a single layer or multi-layer structure. The second functional layer may include an electron transport layer (ETL) and/or an electron injection layer (EIL).

The opposite electrode 230 may face the pixel electrode 210 with the intermediate layer 220 therebetween. The opposite electrode 230 may include a conductive material having a small work function. For example, the opposite electrode 230 may include a (semi-)transparent layer including Ag, Mg, Al, Pt, Pd, Au, Ni, Nd, Ir, Cr, lithium (Li), calcium (Ca), or an alloy thereof. Alternatively, the opposite electrode 230 may further include a layer such as ITO, IZO, ZnO, $In_2O_3$, or a combination thereof, on the (semi-)transparent layer including the materials described above.

FIG. 16 illustrates a driving semiconductor layer A1 of the driving TFT T1 and a compensation semiconductor layer A3 of the compensation TFT T3 that may correspond to part of the first active pattern ACT1 of FIG. 7 and an emission control semiconductor layer A6 of the emission control TFT T6 that may correspond to part of the second active pattern ACT2 of FIG. 12.

Referring to FIGS. 16 and 17, the pixel circuit PC according to an embodiment may include the first multi-layer film ML1 and the second multi-layer film ML2 on the substrate 100, and each of the first multi-layer film ML1 and the second multi-layer film ML2 may include thin-film transistors. Thus, the thin-film transistors included in the first multi-layer film ML1 and the thin-film transistors included in the second multi-layer film ML2 may have a structure in which they may be vertically stacked.

For example, as shown in FIGS. 16 and 17, the driving TFT T1 and the compensation TFT T3 on a lower layer may be provided in case that the first initialization TFT T4 and the emission control TFT T6 on an upper layer may be vertically stacked.

The thin-film transistors according to an embodiment ultimately have a structure of the pixel circuit PC shown in FIG. 3. Thus, compared to the case where the structure of the same pixel circuit PC may be located on the same plane, as the thin-film transistors of an embodiment may be vertically stacked, the area of the pixel circuit PC per one pixel P may be reduced. In case that the pixel circuit PC according to an embodiment may be applied to a transparent display device, the area of the pixel circuit PC may be reduced so that the area of the transmission area TA may be relatively increased. In another embodiment, a display having high resolution may be implemented through the pixel circuit PC according to an embodiment.

Until now, display devices have been described. However, embodiments are not limited thereto. For example, a method of manufacturing the display device as described above may also belong to the scope of the disclosure.

In an embodiment of the disclosure described above, a display device, the device performance of which may be maintained and simultaneously high transmittance of which may be achieved, may be implemented. Of course, the scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, including any equivalents.

What is claimed is:

1. A display device comprising:
   a substrate that includes a pixel area and a transmission area;
   a pixel circuit disposed in the pixel area and comprising:
   a first thin-film transistor included in a first multi-layer film; and
   a second thin-film transistor included in a second multi-layer film on the first multi-layer film, the first thin-film transistor and the second thin-film transistor being electrically connected to each other; and
a display element disposed on the second multi-layer film and comprising:
a pixel electrode electrically connected to the second thin-film transistor via a contact hole defined in the second multi-layer film; and
a pixel-defining layer on the second multi-layer film including a first opening that exposes a portion of the pixel electrode and a second opening corresponding to the transmission area,
wherein each of the first multi-layer film and the second multi-layer film comprises a plurality of sub-layers, and
at least one of the plurality of sub-layers of the first multi-layer film or the second multi-layer film includes an opening below the second opening; wherein the first multi-layer film comprises a scan line and an emission control line that extend in a first direction, and the scan line and the emission control line bypass the transmission area.

2. The display device of claim 1, further comprising a light-transmitting filling layer disposed in the second opening.

3. The display device of claim 2, wherein the light-transmitting filling layer is an electrical insulator that directly contacts the pixel-defining layer.

4. The display device of claim 1, wherein
the first thin-film transistor is spaced apart from the second thin-film transistor,
an insulating layer separates the first thin-film transistor from the second thin-film transistor, and
the first thin-film transistor and the second thin-film transistor are electrically connected to each other via a contact hole defined in the insulating layer.

5. The display device of claim 4, wherein
the first thin-film transistor comprises:
a first semiconductor layer;
a first gate electrode that overlaps the first semiconductor layer; and
a first conductive layer electrically connected to the first semiconductor layer, and
the first multi-layer film further comprises:
an insulating layer disposed on the first conductive layer to cover the first conductive layer.

6. The display device of claim 5, wherein the second thin-film transistor comprises:
a second semiconductor layer disposed on the first conductive layer;
a second gate electrode that overlaps the second semiconductor layer; and
a second conductive layer electrically connected to the second semiconductor layer.

7. The display device of claim 6, wherein at least part of the first conductive layer and at least part of the second conductive layer overlap each other.

8. The display device of claim 7, wherein
the first thin-film transistor comprises a driving thin-film transistor, and
the second thin-film transistor comprises an emission control thin-film transistor.

9. The display device of claim 1, wherein the transmission area extends into a transmission opening passing through the second multi-layer film directly below the second opening.

10. The display device of claim 9, wherein the transmission area further extends into a transmission opening passing through the first multi-layer film below the second opening.

11. The display device of claim 10, further comprising a light-transmitting filling layer disposed in the second opening, the light-transmitting filling layer making direct contact with the substrate.

12. The display device of claim 1, further comprising
an opposite electrode facing the pixel electrode; and
an intermediate layer between the pixel electrode and the opposite electrode, wherein the opposite electrode is spaced apart from the second opening.

13. The display device of claim 1, wherein the transmission area has a polygonal shape in a plan view and spaced apart from the pixel area.

14. A display device comprising:
a substrate that includes a pixel area and a transmission area;
a pixel circuit disposed in the pixel area and comprising:
a first thin-film transistor included in a first multi-layer film; and
a second thin-film transistor included in a second multi-layer film on the first multi-layer film, the first thin-film transistor and the second thin-film transistor being electrically connected to each other; and
a display element disposed on the second multi-layer film and comprising:
a pixel electrode electrically connected to the second thin-film transistor via a contact hole defined in the second multi-layer film; and
a pixel-defining layer on the second multi-layer film including a first opening that exposes a portion of the pixel electrode and a second opening corresponding to the transmission area, wherein
each of the first multi-layer film and the second multi-layer film comprises a plurality of sub-layers, and at least one of the plurality of sub-layers of the first multi-layer film or the second multi-layer film includes an opening below the second opening, and
the opening of the at least one of the plurality of sub-layers is filled with a first material; wherein the first multi-layer film comprises a scan line and an emission control line that extend in a first direction, and the scan line and the emission control line bypass the transmission area.

15. The display device of claim 14, wherein the first material is a part of a light-transmitting filling layer, the light-transmitting filling layer is an electrical insulator.

16. The display device of claim 15, wherein
the light-transmitting filling layer directly contacts the pixel-defining layer, the first multi-layer film, and the second multi-layer film, and
a topmost surface of the light-transmitting filling layer is below a topmost surface of the pixel defining layer and above a bottommost surface of the pixel defining layer.

17. The display device of claim 15, wherein the light-transmitting filling layer includes silicon oxynitride (SiON).

18. The display device of claim 15, wherein the light-transmitting filling layer is thicker than the pixel defining layer.

19. The display device of claim 15, wherein the light-transmitting filling layer makes direct contact with the substrate.

* * * * *